United States Patent
Mangal et al.

(10) Patent No.: US 11,604,223 B1
(45) Date of Patent: Mar. 14, 2023

(54) CLOCK CONTROL SYSTEM FOR SCAN CHAINS

(71) Applicant: NXP USA, INC., Austin, TX (US)

(72) Inventors: Himanshu Mangal, Agra (IN); Amol Agarwal, Noida (IN); Abhishek Mahajan, Noida (IN); Love Gupta, Noida (IN); Pratyush Pranav Joshi, Vadodara (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/644,605

(22) Filed: Dec. 16, 2021

(51) Int. Cl.
*G01R 31/3185* (2006.01)
*G01R 31/317* (2006.01)

(52) U.S. Cl.
CPC ......... *G01R 31/318552* (2013.01); *G01R 31/31701* (2013.01); *G01R 31/318525* (2013.01); *G01R 31/318536* (2013.01)

(58) Field of Classification Search
CPC ...... G01R 31/318552; G01R 31/31701; G01R 31/318525; G01R 31/318536
USPC ........................... 714/731, 729, 727
See application file for complete search history.

(56) References Cited

U.S. PATENT DOCUMENTS

| | | | |
|---|---|---|---|
| 5,485,466 A * | 1/1996 | Lyon | G01R 31/318555 714/731 |
| 8,024,631 B1 | 9/2011 | Bertanzetti | |
| 9,377,510 B2 | 6/2016 | Sonawane et al. | |
| 9,395,414 B2 | 7/2016 | Sonawane et al. | |
| 9,536,031 B2 | 1/2017 | Liao et al. | |
| 9,568,552 B2 | 2/2017 | Lin et al. | |
| 9,599,672 B2 * | 3/2017 | Abhishek | G01R 31/318552 |
| 9,709,629 B2 * | 7/2017 | Sofer | G01R 31/318575 |
| 9,799,379 B2 * | 10/2017 | Priel | G11C 7/22 |
| 10,345,379 B2 * | 7/2019 | Lujan | G01R 31/318552 |
| 10,775,435 B1 * | 9/2020 | Papameletis | G01R 31/318575 |
| 11,073,557 B2 * | 7/2021 | Narayanan | G01R 31/318541 |
| 11,120,187 B1 * | 9/2021 | Hasegawa | H03K 19/00 |
| 2004/0088618 A1 * | 5/2004 | Lurkins | G01R 31/31725 714/726 |
| 2006/0026473 A1 * | 2/2006 | Patrick Tan | G01R 31/318541 714/726 |
| 2020/0355744 A1 * | 11/2020 | Narayanan | G01R 31/318552 |
| 2021/0311121 A1 * | 10/2021 | Narayanan | G01R 31/318541 |

OTHER PUBLICATIONS

Huang, Y., "Test Clock Domain Optimization to Avoid Scan Shift Failure Due to Flip-Flop Simultaneous Triggering", IEEE Transactions on Computer-Aided Design of Integrated Circuits and Systems, vol. 32, No. 4, Apr. 2013.

* cited by examiner

Primary Examiner — John J Tabone, Jr.

(57) ABSTRACT

A clock control system for a scan chain generates two clock signals. During a shift phase of a testing mode of the scan chain, one clock signal is an inverted version of the other clock signal. The clock control system provides the clock signal and the inverted clock signal to two different scan flip-flops of the scan chain, respectively. Each of the two scan flip-flops performs a flip-flop operation when the received clock signal transitions from a de-asserted state to an asserted state. Thus, the two flip-flop operations are mutually exclusive during the shift phase. As a result, a dynamic voltage drop across the scan chain during the shift phase is reduced.

19 Claims, 7 Drawing Sheets

CLOCK CONTROL SYSTEM FOR SCAN CHAINS

FIELD OF USE

The present disclosure relates generally to electronic circuits, and, more particularly, to a clock control system for scan chains.

BACKGROUND

An integrated circuit (IC) includes various scan chains that are utilized for structural testing of the IC. Each scan chain includes a series of scan flip-flops that are synchronized based on a clock signal generated by a clock gate of the IC. Each scan flip-flop of each scan chain is a positive edge-triggered scan flip-flop. Thus, a flip-flop operation (e.g., switching between a logic low state and a logic high state) at each scan flip-flop is performed at a positive edge of an associated clock signal during a testing mode of the scan chains. A number of scan chains included in the IC is significant. Hence, the simultaneous flip-flop operations of various scan chains result in a significant dynamic voltage drop across the scan chains during positive edges of the clock signals.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
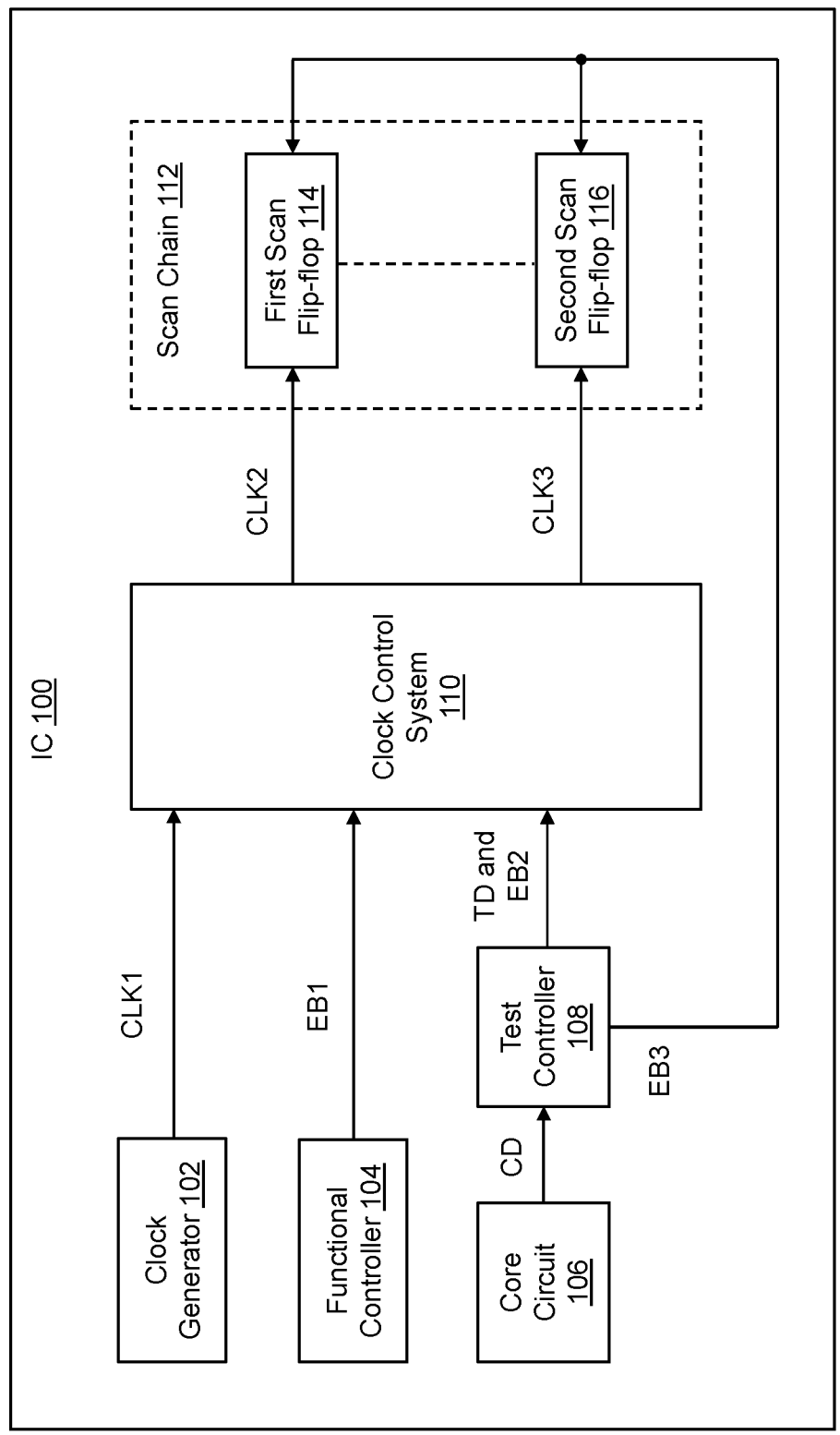
FIG. 1 illustrates a schematic block diagram of an integrated circuit (IC) in accordance with an embodiment of the present disclosure.

The detailed description of the appended drawings is intended as a description of various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In one embodiment of the present disclosure, a circuit is disclosed. The circuit may include a scan chain and a clock control system that may be coupled to the scan chain. The scan chain may include a first scan flip-flop and a second scan flip-flop. The clock control system may be configured to generate a first clock signal and a second clock signal. During a shift phase of a testing mode of the scan chain, the first clock signal is an inverted version of the second clock signal. The clock control system may be further configured to provide the first clock signal and the second clock signal to the first scan flip-flop and the second scan flip-flop, respectively. The first scan flip-flop may be configured to perform a first flip-flop operation when the first clock signal transitions from a de-asserted state to an asserted state. Similarly, the second scan flip-flop may be configured to perform a second flip-flop operation when the second clock signal transitions from the de-asserted state to the asserted state. The first flip-flop operation and the second flip-flop operation are mutually exclusive during the shift phase.

In another embodiment of the present disclosure, a clock control method for a scan chain is disclosed. The clock control method may include generating a first clock signal and a second clock signal by a clock control system. During a shift phase of a testing mode of the scan chain, the first clock signal is an inverted version of the second clock signal. The clock control method may further include providing, by the clock control system, the first clock signal and the second clock signal to a first scan flip-flop and a second scan flip-flop of the scan chain, respectively. A first flip-flop operation of the first scan flip-flop is performed when the first clock signal transitions from a de-asserted state to an asserted state. Similarly, a second flip-flop operation of the second scan flip-flop is performed when the second clock signal transitions from the de-asserted state to the asserted state. The first flip-flop operation and the second flip-flop operation are mutually exclusive during the shift phase.

In some embodiments, during a capture phase of the testing mode, the first clock signal is one of a group consisting of the inverted version of the second clock signal and same as the second clock signal.

In some embodiments, during the capture phase, when the first clock signal is the inverted version of the second clock signal, the first flip-flop operation and the second flip-flop operation are mutually exclusive.

In some embodiments, during the capture phase, when the first clock signal is same as the second clock signal, the first flip-flop operation and the second flip-flop operation are performed simultaneously.

In some embodiments, the clock control system may include processing circuitry and a first clock gate. The processing circuitry may be configured to receive a third clock signal and generate a fourth clock signal based on the third clock signal. During the shift phase, the fourth clock signal is an inverted version of the third clock signal. During the capture phase, the fourth clock signal is one of a group consisting of the inverted version of the third clock signal and same as the third clock signal. The first clock gate may be coupled to the processing circuitry and the first scan flip-flop. The first clock gate may be configured to receive the fourth clock signal and generate the first clock signal based on the fourth clock signal. The first clock signal is de-asserted when the first clock gate is deactivated. Further, the first clock signal is same as the fourth clock signal when the first clock gate is activated. The first clock gate may be further configured to provide the first clock signal to the first scan flip-flop.

In some embodiments, the processing circuitry may be further configured to generate a set of control signals to deactivate and activate the first clock gate. The first clock gate is activated based on assertion of at least one control signal of the set of control signals. Further, the first clock gate is deactivated based on de-assertion of the set of control signals.

In some embodiments, when the fourth clock signal is the inverted version of the third clock signal during the shift phase and is same as the third clock signal during the capture phase, the first clock gate is activated during the shift phase and deactivated for a predetermined time duration during the capture phase. Alternatively, when the fourth clock signal is the inverted version of the third clock signal during the shift phase and the capture phase, the first clock gate is activated during the shift phase and the capture phase.

In some embodiments, the processing circuitry may include an enabling circuit that may be configured to receive trigger data and generate a first control signal and a second control signal based on the trigger data. The trigger data is indicative of the testing mode. A logic state of the fourth clock signal is controlled based on the first control signal. Further, the first clock gate is controlled based on the second control signal.

In some embodiments, during the shift phase and the capture phase, the first control signal is asserted to enable inversion of the third clock signal and the second control signal is asserted to activate the first clock gate.

In some embodiments, during the shift phase, the first control signal is asserted to enable inversion of the third clock signal and the second control signal is asserted to activate the first clock gate. During the capture phase, the first control signal is de-asserted for a first predetermined time duration, and transitions from the de-asserted state to the asserted state after lapse of the first predetermined time duration to disable the inversion of the third clock signal during the capture phase. The second control signal is de-asserted for a second predetermined time duration before the assertion of the first control signal and a third predetermined time duration after the assertion of the first control signal to deactivate the first clock gate during a transition of the first control signal from the de-asserted state to the asserted state.

In some embodiments, the processing circuitry may further include a clock phase converter circuit that may be coupled to the enabling circuit and the first clock gate. The clock phase converter circuit may be configured to receive the first control signal and the third clock signal, generate the fourth clock signal based on the first control signal and the third clock signal, and provide the fourth clock signal to the first clock gate. The fourth clock signal is the inverted version of the third clock signal based on assertion of the first control signal. Further, the fourth clock signal is same as the third clock signal based on de-assertion of the first control signal.

In some embodiments, the processing circuitry may further include a first logic gate that may be coupled to the enabling circuit and the first clock gate. The first logic gate may be configured to generate a third control signal based on the second control signal and a first enable signal that is indicative of a functional mode of the scan chain. Further, the first logic gate may be configured to provide the third control signal to the first clock gate. The third control signal is asserted based on assertion of the second control signal and the first enable signal. Further, the third control signal is de-asserted based on de-assertion of at least one of a group consisting of the second control signal and the first enable signal. The processing circuitry may further include a second logic gate that may be coupled to the enabling circuit and the first clock gate. The second logic gate may be configured to generate a fourth control signal based on the second control signal and a second enable signal that is indicative of the testing mode. Further, the second logic gate may be configured to provide the fourth control signal to the first clock gate. The fourth control signal is asserted based on the assertion of the second control signal and assertion of the second enable signal. Further, the fourth control signal is de-asserted based on at least one of a group consisting of the de-assertion of the second control signal and de-assertion of the second enable signal. The first clock gate is activated based on the assertion of at least one of a group consisting of the third control signal and the fourth control signal. Further, the first clock gate is deactivated based on the de-assertion of the third control signal and the fourth control signal.

In some embodiments, the circuit may further include a functional controller and a test controller that may be configured to generate the first enable signal and the second enable signal, respectively. The first enable signal is one of a group consisting of asserted and de-asserted during the functional mode to control the first clock gate during the functional mode. Further, the second enable signal is asserted during the shift phase and the capture phase of the testing mode to control the first clock gate during the testing mode.

In some embodiments, the first clock gate may include a third logic gate that may be coupled to the first logic gate and the second logic gate. The third logic gate may be configured to generate a fifth control signal based on the third control signal and the fourth control signal. The fifth control signal is de-asserted based on the de-assertion of the third control signal and the fourth control signal. Further, the fifth control signal is asserted based on the assertion of at least one of a group consisting of the third control signal and the fourth control signal. The first clock gate may further include a latch that may be coupled to the third logic gate. The latch may be configured to receive the fifth control signal and the fourth clock signal and generate a sixth control signal based on the fifth control signal and the fourth clock signal. The sixth control signal is same as the fifth control signal based on de-assertion of the fourth clock signal. The first clock gate may further include a fourth logic gate that may be coupled to the latch and the first scan flip-flop. The fourth logic gate may be configured to generate the first clock signal based on the sixth control signal and the fourth clock signal. The first clock signal is asserted based on assertion of the sixth control signal and the fourth clock signal, and the first clock signal is de-asserted based on at least one of a group consisting of de-assertion of the sixth control signal and the de-assertion of the fourth clock signal.

In some embodiments, the third clock signal may include one or more clock pulses for facilitating one or more flip-flop operations during the shift phase, respectively, and one or more clock pulses for facilitating one or more flip-flop operations during the capture phase, respectively.

In some embodiments, the clock control system may further include a trimming circuit. The trimming circuit may be configured to receive a fifth clock signal and generate the third clock signal such that a number of clock pulses of the third clock signal is less than a number of clock pulses of the fifth clock signal.

In some embodiments, the clock control system may further include a second clock gate that may be coupled to the second scan flip-flop. The second clock gate may be configured to receive a third clock signal, generate the second clock signal based on the third clock signal, and provide the second clock signal to the second scan flip-flop. The second clock signal is de-asserted when the second clock gate is deactivated. Further, the second clock signal is same as the third clock signal when the second clock gate is activated. The second clock gate is activated during the shift phase and the capture phase.

Various embodiments of the present disclosure disclose an integrated circuit (IC) that includes a scan chain and a clock control system for controlling the scan chain. The scan chain may include two sets of scan flip-flops. The clock control system generates two clock signals and provides the two clock signals to the two sets of scan flip-flops, respectively. During a shift phase of a testing mode of the scan chain, the two clock signals are inverted versions of each other. Further, during a capture phase of the testing mode, the two clock signals may be same or may be inverted versions of each other. Each scan flip-flop performs a flip-flop operation (e.g., switching between a logic low state and a logic high state) during a positive edge of the corresponding clock signal received from the clock control system. Thus, the flip-flop operations of the two sets of scan flip-flops are mutually exclusive (e.g., are not performed simultaneously) during the shift phase. Further, during the capture phase, the flip-flop operations of the two sets of scan flip-flops may be mutually exclusive or may be performed simultaneously. As the two sets of scan flip-flops do not simultaneously perform flip-flop operations during at least one phase of the testing mode, a dynamic voltage drop across the scan chain is significantly reduced.

Conventionally, various scan chains of an IC are divided into multiple partitions (e.g., a logic built-in self-test (LBIST) partition) such that the scan chains of various partitions receive staggered clock signals. Such a technique of controlling the scan chains reduces a dynamic voltage drop in the IC during a testing mode. However, within a partition, the scan flip-flops of various scan chains continue to perform the associated flip-flop operations simultaneously. Thus, the dynamic voltage drop across the scan chains of one partition is still significant. Also, as such scan flip-flops are located in close proximity on the IC, localized voltage hotspots are created on the IC that may damage the IC. Further, the partitioning of the scan chains leads to a significant increase in the design complexity of the IC. When the scan chains are partitioned, a dedicated test controller is required to be included on the IC for controlling the scan flip-flops of each partition. Hence, the size of the IC significantly increases. Further, in some cases, partitioning of the scan chains on the IC may not be feasible, and hence, some conventional techniques of controlling scan chains cannot be implemented in such ICs.

In the clock control system of some embodiments of the present disclosure, two sets of scan flip-flops within a single scan chain perform associated flip-flop operations in a non-simultaneous manner. Thus, the dynamic voltage drop in the IC that includes the clock control system is reduced. A density of scan flip-flops of the two sets of scan flip-flops is uniform across the IC, thereby preventing the creation of localized voltage hotspots on the IC. Further, as the dynamic voltage drop is reduced by ensuring that two sets of scan flip-flops of each scan chain do not perform associated flip-flop operations simultaneously, a need to partition the scan chains is eliminated. Hence, the design complexity of such an IC is significantly less than that of an IC where some conventional techniques of controlling scan chains are implemented. Further, as the scan chains are not partitioned, a need to include a dedicated test controller in the IC for controlling scan flip-flops of each partition is eliminated. Hence, the size of the IC that includes the clock control system of some embodiments of the present disclosure is significantly less than that of the IC where some conventional techniques of controlling scan chains are implemented.

FIG. 1 illustrates a schematic block diagram of an integrated circuit (IC) 100 in accordance with an embodiment of the present disclosure. The IC 100 may include a clock generator 102, a functional controller 104, a core circuit 106, a test controller 108, a clock control system 110, and a scan chain 112. The scan chain 112 may be utilized for the structural testing of the IC 100 (e.g., to detect structural faults in the IC 100). The scan chain 112 may include a first set of scan flip-flops of which a first scan flip-flop 114 is shown, and a second set of scan flip-flops of which a second scan flip-flop 116 is shown. Further, the scan chain 112 (e.g., the first and second sets of scan flip-flops) may operate in a functional mode or a testing mode. During the functional mode, functional data is stored in the first and second sets of scan flip-flops, whereas during the testing mode, the IC 100 is tested for structural faults based on the scan chain 112. Further, the testing mode includes two phases, namely, a shift phase and a capture phase. During the shift phase, a test pattern is shifted across the scan chain 112 and during the capture phase, a response of the IC 100 to the test pattern is captured. The capture phase is followed by another shift phase for shifting the captured response out of the scan chain 112. The IC 100 is tested for structural faults based on the captured response. The IC 100 may be utilized in automotive devices, data processing devices, networking devices, or the like.

The clock generator 102 may be coupled to the clock control system 110. The clock generator 102 may include suitable circuitry that may be configured to perform one or more operations. For example, the clock generator 102 may be configured to generate a first clock signal CLK1. The scan chain 112 may be controlled based on the first clock signal CLK1. The first clock signal CLK1 may include various clock pulses that may be utilized by the scan chain 112 during the shift and capture phases. The clock generator 102 may be further configured to provide the first clock signal CLK1 to the clock control system 110.

Although FIG. 1 illustrates that all of the circuits are implemented on IC 100, in other embodiments, some circuits may be located external to the IC 100, without deviating from the scope of the present disclosure. For example, in some embodiments, the clock generator 102 may be external to the IC 100.

The functional controller 104 may be coupled to the clock control system 110. The functional controller 104 may include suitable circuitry that may be configured to perform one or more operations. For example, the functional controller 104 may be configured to generate a first enable signal EB1 and provide the first enable signal EB1 to the clock control system 110. The first enable signal EB1 may be indicative of the functional mode of the scan chain 112, and may control an operation of the clock control system 110 during the functional mode. During the functional mode, the functional controller 104 may assert the first enable signal EB1 (e.g., generate the first enable signal EB1 at a logic high state) or de-assert the first enable signal EB1 (e.g., generate the first enable signal EB1 at a logic low state) based on functional operations associated with the scan chain 112. Further, during the testing mode, the functional controller 104 may de-assert or assert the first enable signal EB1.

However, the logic state of the first enable signal EB1 during the testing mode does not affect the scan chain 112 as the scan chain 112 is controlled by the test controller 108 during the testing mode.

Although FIG. 1 illustrates that the IC 100 includes one functional controller (e.g., the functional controller 104), the scope of the present disclosure is not limited to it. In various other embodiments, the IC 100 may include multiple functional controllers that provide multiple enable signals (such as the first enable signal EB1) to the clock control system 110, without deviating from the scope of the present disclosure.

The core circuit 106 may include suitable circuitry that may be configured to perform one or more operations. For example, the core circuit 106 may be configured to generate configuration data CD. The configuration data CD may indicate a current mode of the scan chain 112 (e.g., the functional mode or the testing mode). When the current mode corresponds to the testing mode, the configuration data CD may further indicate a type of the testing mode (e.g., an automatic test pattern generation (ATPG) testing mode or a logic built-in self-test (LBIST) mode). Further, the configuration data CD may define clock controls during the shift phase and the capture phase of the testing mode. For example, the configuration data CD may define whether the first and second scan flip-flops 114 and 116 are operational at a positive edge or a negative edge of the first clock signal CLK1 during the shift and capture phases of the testing mode.

The test controller 108 may be coupled to the core circuit 106 and the clock control system 110. The test controller 108 may include suitable circuitry that may be configured to perform one or more operations. For example, the test controller 108 may be configured to receive the configuration data CD from the core circuit 106. Based on the configuration data CD, the test controller 108 may be configured to generate trigger data TD, a second enable signal EB2, and a third enable signal EB3. The trigger data TD may be indicative of the testing mode of the scan chain 112. For example, the trigger data TD may be indicative of the activation of the testing mode and the clock controls during the shift and capture phases of the testing mode.

The second enable signal EB2 may be indicative of the testing mode and may control the clock operation of the clock control system 110 during the testing mode. For example, the test controller 108 de-asserts the second enable signal EB2 (e.g., generates the second enable signal EB2 at a logic low state) during the functional mode. Further, the test controller 108 asserts the second enable signal EB2 (e.g., generates the second enable signal EB2 at a logic high state) during the testing mode. The testing mode may correspond to the ATPG testing mode or the LBIST mode. The third enable signal EB3 may control the operation of the scan chain 112 during the functional and testing modes. For example, the test controller 108 de-asserts the third enable signal EB3 (e.g., generates the third enable signal EB3 at a logic low state) during the functional mode and the capture phase of the testing mode. Further, the test controller 108 asserts the third enable signal EB3 (e.g., generates the third enable signal EB3 at a logic high state) during the shift phase of the testing mode. The test controller 108 may be further configured to provide the trigger data TD and the second enable signal EB2 to the clock control system 110 and the third enable signal EB3 to the scan chain 112. The configuration data CD may further be utilized by the test controller 108 to perform various other operations associated with the structural testing of the IC 100.

The clock control system 110 may be coupled to the clock generator 102, the functional controller 104, the test controller 108, and the scan chain 112. Further, the clock control system 110 may be configured to receive the first clock signal CLK1 and the first enable signal EB1 from the clock generator 102 and the functional controller 104, respectively. The clock control system 110 may be further configured to receive the trigger data TD and the second enable signal EB2 from the test controller 108.

The clock control system 110 may be further configured to generate a second clock signal CLK2 based on the first clock signal CLK1 and the first and second enable signals EB1 and EB2. The clock control system 110 may be further configured to provide the second clock signal CLK2 to the first scan flip-flop 114. Further, the clock control system 110 may be configured to generate a third clock signal CLK3 based on the first clock signal CLK1, the first and second enable signals EB1 and EB2, and the trigger data TD. The clock control system 110 may be further configured to provide the third clock signal CLK3 to the second scan flip-flop 116.

The second and third clock signals CLK2 and CLK3 are derived from the first clock signal CLK1. Further, a number of clock pulses of each of the second and third clock signals CLK2 and CLK3 is less than a number of clock pulses of the first clock signal CLK1. The second and third clock signals CLK2 and CLK3 control operations of the first and second scan flip-flops 114 and 116, respectively.

The third clock signal CLK3 is an inverted version of the second clock signal CLK2 during the shift phase of the testing mode. Thus, flip-flop operations (e.g., switching between a logic low state and a logic high state) of the first and second scan flip-flops 114 and 116 are mutually exclusive (e.g., are not performed simultaneously) during the shift phase. Hence, a dynamic voltage drop across the scan chain 112 significantly reduces during the shift phase. During the capture phase of the testing mode, the third clock signal CLK3 may be the inverted version of the second clock signal CLK2 or may be same as the second clock signal CLK2. When the third clock signal CLK3 is same as the second clock signal CLK2 during the capture phase, the flip-flop operations of the first and second scan flip-flops 114 and 116 are performed simultaneously. Conversely, when the third clock signal CLK3 is the inverted version of the second clock signal CLK2 during the capture phase, the flip-flop operations of the first and second scan flip-flops 114 and 116 are mutually exclusive (e.g., are not performed simultaneously). In such a scenario, the dynamic voltage drop across the scan chain 112 further reduces during the capture phase. During the functional mode, the second and third clock signals CLK2 and CLK3 may be generated based on functional operations associated with the first and second scan flip-flops 114 and 116, respectively. In such a scenario, the second and third clock signals CLK2 and CLK3 may be synchronous or staggered, and a frequency of the first clock signal CLK1 may be greater than that utilized for the testing mode.

The scan chain 112 may be coupled to the clock control system 110 and the test controller 108. The scan chain 112 may include the first and second sets of scan flip-flops of which the first scan flip-flop 114 and the second scan flip-flop 116 are shown, respectively. In an embodiment, each scan flip-flop of the first and second sets of scan flip-flops are positive edge-triggered scan flip-flops. The first and second sets of scan flip-flops are coupled in series to form the scan chain 112. In an embodiment, the first set of scan flip-flops is appended to the second set of scan flip-flops to form the scan chain 112. In other words, an initial scan flip-flop of the first set of scan flip-flops receives a flop output bit of the last scan flip-flop of the second set of scan flip-flops. Thus, in the series of scan flip-flops that form the scan chain 112, the first scan flip-flop 114 may be after the second scan flip-flop 116. Further, the first and second scan flip-flops 114 and 116 may be directly coupled to each other or may be coupled by way of one or more scan flip-flops. In an example, a number of scan flip-flops of the first set of scan flip-flops is equal to a number of scan flip-flops of the second set of scan flip-flops. In another example, the number of scan flip-flops of the first set of scan flip-flops is different from the number of scan flip-flops of the second set of scan flip-flops.

The first and second scan flip-flops 114 and 116 may be configured to receive the second and third clock signals CLK2 and CLK3 from the clock control system 110, respectively. Further, the first and second scan flip-flops 114 and 116 may be configured to receive the third enable signal EB3 from the test controller 108. Although not shown in FIG. 1, the first and second scan flip-flops 114 and 116 may additionally receive various functional data bits and various test pattern bits. Based on the second and third clock signals CLK2 and CLK3, the third enable signal EB3, the functional data bits, and the test pattern bits, the first and second scan flip-flops 114 and 116 may be configured to perform various flip-flop operations associated therewith. For example, at a positive edge of the second clock signal CLK2, the first scan flip-flop 114 may be configured to perform a first flip-flop operation (e.g., a flop output bit is generated based on an associated functional data bit or an associated test pattern bit). The first flip-flop operation may result in a switching activity across the first scan flip-flop 114 if the flop output bit toggles (e.g., switches from a logic low state to a logic high state or from a logic high state to a logic low state). Similarly, at a positive edge of the third clock signal CLK3, the second scan flip-flop 116 may be configured to perform a second flip-flop operation.

During the shift phase, the third clock signal CLK3 is the inverted version of the second clock signal CLK2. Thus, the first and second flip-flop operations are mutually exclusive (e.g., are not performed simultaneously) during the shift phase. During the capture phase, the third clock signal CLK3 may be the inverted version of the second clock signal CLK2 or may be same as the second clock signal CLK2. When the third clock signal CLK3 is the inverted version of the second clock signal CLK2 during the capture phase, the first and second flip-flop operations are mutually exclusive. Conversely, when the third clock signal CLK3 is same as the second clock signal CLK2 during the capture phase, the first and second flip-flop operations are performed simultaneously.

Each scan flip-flop of the first set of scan flip-flops operates in a similar manner as that of the first scan flip-flop 114 and each scan flip-flop of the second set of scan flip-flops operates in a similar manner as that of the second scan flip-flop 116. In an embodiment, each scan flip-flop of the first set of scan flip-flops receives the second clock signal CLK2 and each scan flip-flop of the second set of scan flip-flops receives the third clock signal CLK3. In another embodiment, each scan flip-flop of the first set of scan flip-flops receives a different clock signal that is logically similar to the second clock signal CLK2 and each scan flip-flop of the second set of scan flip-flops receives a different clock signal that is logically similar to the third clock signal CLK3. In yet another embodiment, two or more scan flip-flops of the first set of scan flip-flops receive the second clock signal CLK2 and the remaining scan flip-flops of the first set of scan flip-flops receive different clock signals that are logically similar to the second clock signal CLK2. Similarly, two or more scan flip-flops of the second set of scan flip-flops receive the third clock signal CLK3 and the remaining scan flip-flops of the second set of scan flip-flops receive different clock signals that are logically similar to the third clock signal CLK3.

Thus, the first set of scan flip-flops performs the associated flip-flop operations when the second clock signal CLK2 transitions from a de-asserted state (e.g., a logic low state) to an asserted state (e.g., a logic high state). Similarly, the second set of scan flip-flops performs the associated flip-flop operations when the third clock signal CLK3 transitions from the de-asserted state to the asserted state. The second clock signal CLK2 may be synchronous with a trimmed version of the first clock signal CLK1, and the trimmed version of the first clock signal CLK1 may be inverted to generate the third clock signal CLK3. Thus, during the shift phase, the test pattern is shifted across the second set of scan flip-flops at negative edges of the first clock signal CLK1, whereas the test pattern is shifted across the first set of scan flip-flops at positive edges of the first clock signal CLK1. Further, during the capture phase, the second set of scan flip-flops captures the response of the IC 100 at a negative edge or a positive edge of the first clock signal CLK1, whereas the first set of scan flip-flops captures the response at a positive edge of the first clock signal CLK1.

The location of the first and second sets of scan flip-flops on the IC 100 may be such that a density of such scan flip-flops is uniform across the IC 100 to avoid localized voltage hotspots on the IC 100. For example, if a portion of the IC 100 includes 4 scan flip-flops, two scan flip-flops from the first set of scan flip-flops and two scan flip-flops from the second set of scan flip-flops may be included in such a portion of the IC 100.

The IC 100 is shown to include one scan chain (e.g., the scan chain 112) to make the illustrations concise and clear and should not be considered as a limitation of the present disclosure. In various other embodiments, the IC 100 may include more than one scan chain, without deviating from the scope of the present disclosure. In such a scenario, an operation of each additional scan chain may be controlled in a similar manner as described above.

Figure 2:
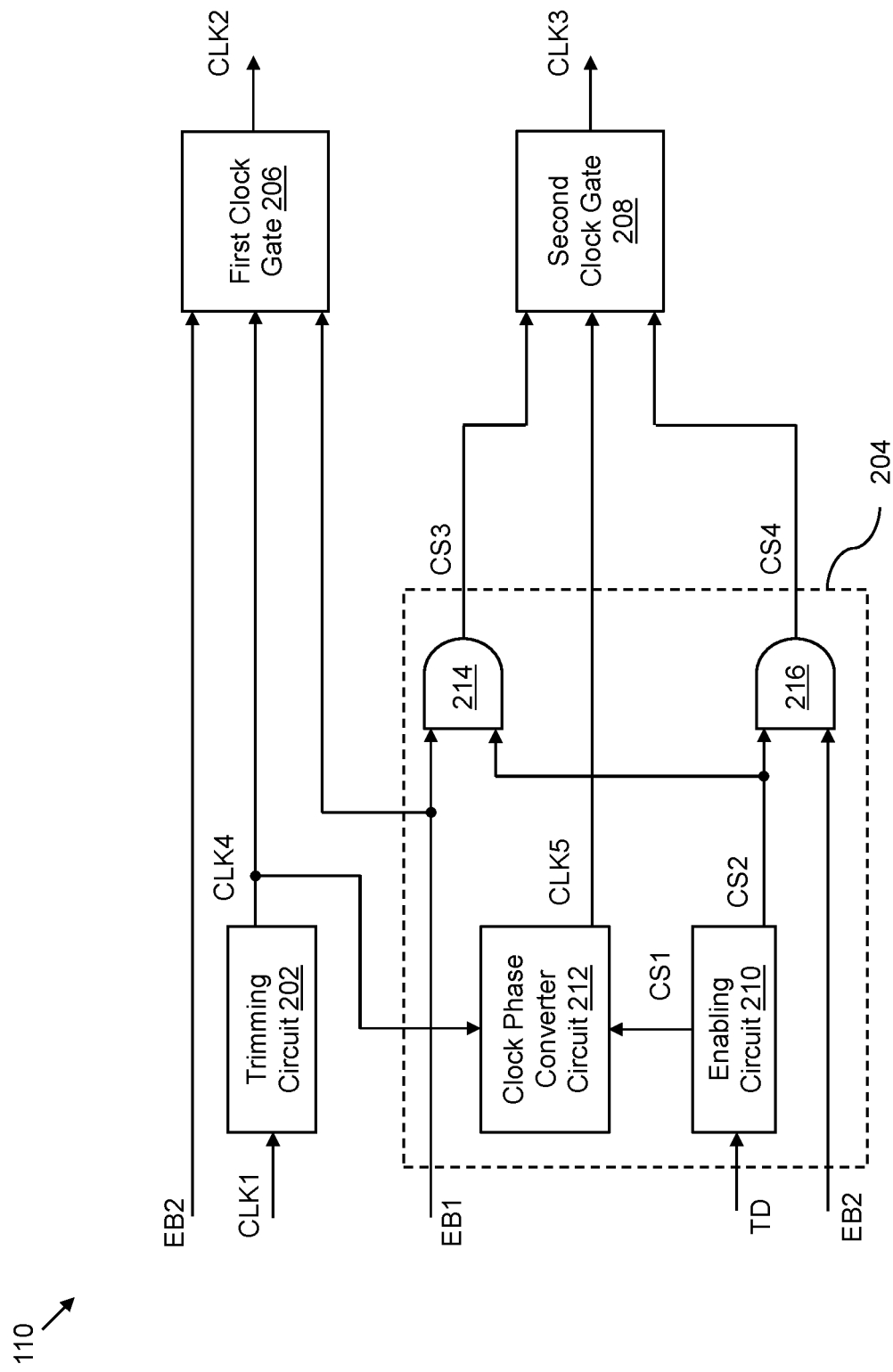
FIG. 2 illustrates a schematic block diagram of a clock control system of the IC of FIG. 1 in accordance with an embodiment of the present disclosure.

FIG. 2 illustrates a schematic block diagram of the clock control system 110 in accordance with an embodiment of the present disclosure. The clock control system 110 may include a trimming circuit 202 and processing circuitry 204. The clock control system 110 may further include a first set of clock gates of which a first clock gate 206 is shown. Further, the clock control system 110 may include a second set of clock gates of which a second clock gate 208 is shown. The first and second sets of clock gates may be coupled to the first and second sets of scan flip-flops, respectively. Thus, the first and second clock gates 206 and 208 may be coupled to the first and second scan flip-flops 114 and 116, respectively. The first and second sets of clock gates are selected such that the associated first and second sets of scan flip-flops are uniformly located across the IC 100 to avoid localized voltage hotspots on the IC 100.

The trimming circuit 202 may be coupled to the clock generator 102, the processing circuitry 204, and the first clock gate 206. The trimming circuit 202 may include suitable circuitry that may be configured to perform one or more operations. For example, the trimming circuit 202 may be configured to receive the first clock signal CLK1 from the clock generator 102. Further, the trimming circuit 202 may be configured to generate a fourth clock signal CLK4. The fourth clock signal CLK4 includes one or more clock pulses for facilitating one or more flip-flop operations during the shift phase, respectively, and one or more clock pulses for facilitating one or more flip-flop operations during the capture phase, respectively. The fourth clock signal CLK4 is generated such that the fourth clock signal CLK4 is the trimmed version of the first clock signal CLK1. In other words, a number of clock pulses of the fourth clock signal CLK4 is less than that of the first clock signal CLK1. Although not shown, the trimming circuit 202 may receive one or more control signals from the test controller 108 that control the operation of (e.g., activate and deactivate) the trimming circuit 202. The trimming circuit 202 may be further configured to provide the fourth clock signal CLK4 to the processing circuitry 204 and the first clock gate 206. In an embodiment, the trimming circuit 202 corresponds to a clock gate.

Although FIG. 2 illustrates that the clock control system 110 includes the trimming circuit 202, the scope of the present disclosure is not limited to it. In various embodiments, the clock control system 110 may be sans a trimming circuit, without deviating from the scope of the present disclosure. In such a scenario, the clock generator 102 may be configured to provide the first clock signal CLK1 to the processing circuitry 204 and the first clock gate 206.

The first clock gate 206 may be coupled to the functional controller 104, the test controller 108, the trimming circuit 202, and the first scan flip-flop 114. The first clock gate 206 may be configured to receive the first and second enable signals EB1 and EB2 from the functional controller 104 and the test controller 108, respectively. Further, the first clock gate 206 may be configured to receive the fourth clock signal CLK4 from the trimming circuit 202. Based on the fourth clock signal CLK4 and the first and second enable signals EB1 and EB2, the first clock gate 206 may be further configured to generate the second clock signal CLK2.

The first and second enable signals EB1 and EB2 control the operation of the first clock gate 206. The first clock gate 206 is deactivated (e.g., is non-operational) based on the de-assertion of the first and second enable signals EB1 and EB2 (e.g., when the first and second enable signals EB1 and EB2 are de-asserted). In such a scenario, the second clock signal CLK2 is de-asserted (e.g., is at a logic low state). Further, the first clock gate 206 is activated (e.g., is operational) based on the assertion of at least one of the first and second enable signals EB1 and EB2 (e.g., when at least one of the first and second enable signals EB1 and EB2 is asserted). In such a scenario, the second clock signal CLK2 is same as the fourth clock signal CLK4. The first clock gate 206 is activated during the entire testing mode (e.g., during both the shift and capture phases). Thus, the second clock signal CLK2 is same as the fourth clock signal CLK4 during the entire testing mode. Further, during the functional mode, the first clock gate 206 may be activated or deactivated based on the first enable signal EB1. The first clock gate 206 may be configured to provide the second clock signal CLK2 to the first scan flip-flop 114. Each clock gate of the first set of clock gates operates in a similar manner as that of the first clock gate 206.

The processing circuitry 204 may be coupled to the functional controller 104, the test controller 108, the trimming circuit 202, and the second clock gate 208. The processing circuitry 204 may be configured to receive the first enable signal EB1 and the fourth clock signal CLK4 from the functional controller 104 and the trimming circuit 202, respectively. Further, the processing circuitry 204 may be configured to receive the trigger data TD and the second enable signal EB2 from the test controller 108. Based on the fourth clock signal CLK4 and the trigger data TD, the processing circuitry 204 may be further configured to generate a fifth clock signal CLK5. The fifth clock signal CLK5 is an inverted version of the fourth clock signal CLK4 during the shift phase. During the capture phase, the fifth clock signal CLK5 may be the inverted version of the fourth clock signal CLK4 or same as the fourth clock signal CLK4 (e.g., may be logically similar to the fourth clock signal CLK4). Further, during the functional mode, the fifth clock signal CLK5 is same as the fourth clock signal CLK4. The processing circuitry 204 may be further configured to generate a set of control signals based on the trigger data TD and the first and second enable signals EB1 and EB2. The processing circuitry 204 may be further configured to provide the fifth clock signal CLK5 and the set of control signals to the second clock gate 208. The third clock signal CLK3 is generated by the second clock gate 208 based on the fifth clock signal CLK5 and the set of control signals.

The processing circuitry 204 generates the set of control signals to control the operation of the second clock gate 208. For example, the processing circuitry 204 generates the set of control signals such that the second clock gate 208 is activated (e.g., is operational) during the shift and capture phases. The second clock gate 208 is activated during the shift and capture phases when the fifth clock signal CLK5 is the inverted version of the fourth clock signal CLK4 during the shift and capture phases. Alternatively, the processing circuitry 204 generates the set of control signals such that the second clock gate 208 is activated (e.g., is operational) during the shift phase, and deactivated (e.g., is non-operational) for a first predetermined time duration before activation of the shift phase (e.g., during the capture phase). The second clock gate 208 is activated during the shift phase and deactivated for the first predetermined time duration during the capture phase when the fifth clock signal CLK5 is the inverted version of the fourth clock signal CLK4 during the shift phase and is same as the fourth clock signal CLK4 during the capture phase. The processing circuitry 204 may include an enabling circuit 210, a clock phase converter circuit 212, a first logic gate 214, and a second logic gate 216.

The enabling circuit 210 may be coupled to the test controller 108, the clock phase converter circuit 212, and the first and second logic gates 214 and 216. The enabling circuit 210 may include suitable circuitry that may be configured to perform one or more operations. For example, the enabling circuit 210 may be configured to receive the trigger data TD from the test controller 108. The trigger data TD may be indicative of the activation of the testing mode and the clock controls during the shift and capture phases of the testing mode. The enabling circuit 210 may be further configured to generate a first control signal CS1 and a second control signal CS2 based on the trigger data TD. The first control signal CS1 controls a logic state of the fifth clock signal CLK5, and in turn, of the third clock signal CLK3. Further, the second clock gate 208 is controlled based on the second control signal CS2. The enabling circuit 210 may be further configured to provide the first control signal CS1 to the clock phase converter circuit 212 and the second control signal CS2 to the first and second logic gates 214 and 216.

The enabling circuit 210 asserts the first control signal CS1 (e.g., generates the first control signal CS1 at a logic high state) to enable inversion of the fourth clock signal CLK4. Conversely, the enabling circuit 210 de-asserts the first control signal CS1 (e.g., generates the first control signal CS1 at a logic low state) to disable the inversion of the fourth clock signal CLK4. Further, the enabling circuit 210 de-asserts the second control signal CS2 (e.g., generates the second control signal CS2 at a logic low state) to deactivate the second clock gate 208. Conversely, the enabling circuit 210 asserts the second control signal CS2 (e.g., generates the second control signal CS2 at a logic high state) to activate the second clock gate 208.

The clock phase converter circuit 212 may be coupled to the trimming circuit 202, the enabling circuit 210, and the second clock gate 208. The clock phase converter circuit 212 may include suitable circuitry that may be configured to perform one or more operations. For example, the clock phase converter circuit 212 may be configured to receive the fourth clock signal CLK4 and the first control signal CS1 from the trimming circuit 202 and the enabling circuit 210, respectively. The clock phase converter circuit 212 may be further configured to generate the fifth clock signal CLK5 based on the first control signal CS1 and the fourth clock signal CLK4.

The clock phase converter circuit 212 de-asserts the fifth clock signal CLK5 (e.g., generates the fifth clock signal CLK5 at a logic low state) based on the de-assertion of the fourth clock signal CLK4 and the first control signal CS1. Similarly, the clock phase converter circuit 212 de-asserts the fifth clock signal CLK5 based on the assertion of the fourth clock signal CLK4 and the first control signal CS1. Further, the clock phase converter circuit 212 asserts the fifth clock signal CLK5 (e.g., generates the fifth clock signal CLK5 at a logic high state) based on the assertion of the fourth clock signal CLK4 or the first control signal CS1. In other words, the fifth clock signal CLK5 is the inverted version of the fourth clock signal CLK4 when the first control signal CS1 is asserted. Further, the fifth clock signal CLK5 is same as the fourth clock signal CLK4 when the first control signal CS1 is de-asserted. The clock phase converter circuit 212 may be further configured to provide the fifth clock signal CLK5 to the second clock gate 208. In an embodiment, the clock phase converter circuit 212 corresponds to an exclusive-OR (XOR) gate. However, in other embodiments, the clock phase converter circuit 212 may be implemented using different circuitry.

The first logic gate 214 may be coupled to the functional controller 104, the enabling circuit 210, and the second clock gate 208. The first logic gate 214 may be configured to receive the first enable signal EB1 and the second control signal CS2 from the functional controller 104 and the enabling circuit 210, respectively. The first logic gate 214 may be further configured to generate a third control signal CS3 based on the first enable signal EB1 and the second control signal CS2 and provide the third control signal CS3 to the second clock gate 208. In an embodiment, the first logic gate 214 is an AND gate. Thus, the first logic gate 214 asserts the third control signal CS3 (e.g., generates the third control signal CS3 at a logic high state) based on the assertion of the first enable signal EB1 and the second control signal CS2 (e.g., when the first enable signal EB1 and the second control signal CS2 are asserted). Further, the first logic gate 214 de-asserts the third control signal CS3 (e.g., generates the third control signal CS3 at a logic low state) based on the de-assertion of at least one of the first enable signal EB1 and the second control signal CS2 (e.g., when at least one of the first enable signal EB1 and the second control signal CS2 is de-asserted).

The second logic gate 216 may be coupled to the enabling circuit 210, the test controller 108, and the second clock gate 208. The second logic gate 216 may be configured to receive the second control signal CS2 and the second enable signal EB2 from the enabling circuit 210 and the test controller 108, respectively. The second logic gate 216 may be further configured to generate a fourth control signal CS4 based on the second control signal CS2 and the second enable signal EB2 and provide the fourth control signal CS4 to the second clock gate 208. In an embodiment, the second logic gate 216 is an AND gate. Thus, the second logic gate 216 asserts the fourth control signal CS4 (e.g., generates the fourth control signal CS4 at a logic high state) based on the assertion of the second enable signal EB2 and the second control signal CS2 (e.g., when the second enable signal EB2 and the second control signal CS2 are asserted). Further, the second logic gate 216 de-asserts the fourth control signal CS4 (e.g., generates the fourth control signal CS4 at a logic low state) based on the de-assertion of at least one of the second enable signal EB2 and the second control signal CS2 (e.g., when at least one of the second enable signal EB2 and the second control signal CS2 is de-asserted). Further, the set of control signals includes the third and fourth control signals CS3 and CS4. In other words, the third and fourth control signals CS3 and CS4 may be collectively referred to as the "set of control signals CS3 and CS4".

The second clock gate 208 may be coupled to the processing circuitry 204 and the second scan flip-flop 116. The second clock gate 208 may be configured to receive the third and fourth control signals CS3 and CS4 from the first and second logic gates 214 and 216, respectively. Further, the second clock gate 208 may be configured to receive the fifth clock signal CLK5 from the clock phase converter circuit 212. Based on the fifth clock signal CLK5 and the third and fourth control signals CS3 and CS4, the second clock gate 208 may be further configured to generate the third clock signal CLK3.

The third and fourth control signals CS3 and CS4 control the operation of the second clock gate 208. The second clock gate 208 is deactivated (e.g., is non-operational) based on the de-assertion of the third and fourth control signals CS3 and CS4 (e.g., when the third and fourth control signals CS3 and CS4 are de-asserted). In such a scenario, the third clock signal CLK3 is de-asserted (e.g., is at a logic low state). Further, the second clock gate 208 is activated (e.g., is operational) based on the assertion of at least one of the third and fourth control signals CS3 and CS4 (e.g., when at least one of the third and fourth control signals CS3 and CS4 is asserted). In such a scenario, the third clock signal CLK3 is same as the fifth clock signal CLK5. Further, the second clock gate 208 may be configured to provide the third clock signal CLK3 to the second scan flip-flop 116. Each clock gate of the second set of clock gates operates in a similar manner as that of the second clock gate 208.

During the shift phase, the enabling circuit 210 asserts the first control signal CS1. Thus, the fifth clock signal CLK5 is the inverted version of the fourth clock signal CLK4. Further, the enabling circuit 210 asserts the second control signal CS2 and the test controller 108 asserts the second enable signal EB2. Thus, the second clock gate 208 is activated, and the third clock signal CLK3 is same as the fifth clock signal CLK5. In other words, the third clock signal CLK3 is the inverted version of the second clock signal CLK2 during the shift phase.

During the capture, the enabling circuit 210 asserts the first control signal CS1 and the second control signal CS2. Thus, the fifth clock signal CLK5 is the inverted version of the fourth clock signal CLK4. Further, the second enable signal EB2 is asserted during the capture phase. Thus, the second clock gate 208 is activated and the third clock signal CLK3 is same as the fifth clock signal CLK5. In other words, the third clock signal CLK3 is the inverted version of the second clock signal CLK2 during the capture phase.

The enabling circuit 210 alternatively de-asserts the first control signal CS1 for a second predetermined time duration of the capture phase. Further, the first control signal CS1 transitions from the de-asserted state to the asserted state (e.g., from a logic low state to a logic high state) after a lapse of the second predetermined time duration and remains asserted for the remaining time duration of the capture phase. In such a scenario, the fifth clock signal CLK5 is same as the fourth clock signal CLK4 during the second predetermined time duration of the capture phase. It is assumed that the clock pulse of the capture phase is generated during the second predetermined time duration of the capture phase. Further, the enabling circuit 210 de-asserts the second control signal CS2 for a third predetermined time duration before the assertion of the first control signal CS1 and a fourth predetermined time duration after the assertion of the first control signal CS1. The second control signal CS2 is asserted for the remaining time duration of the capture phase. The second clock gate 208 is thus deactivated for the third predetermined time duration before the assertion of the first control signal CS1 and the fourth predetermined time duration after the assertion of the first control signal CS1. A sum of the third and fourth predetermined time durations is equal to the first predetermined time duration. In other words, the second clock gate 208 is deactivated during the first predetermined time duration of the capture phase. Further, the second clock gate 208 is activated for the remaining time duration of the capture phase. Thus, during the capture phase, the third clock signal CLK3 is same as the second clock signal CLK2 when the second clock gate 208 is activated, and the third clock signal CLK3 is de-asserted when the second clock gate 208 is deactivated.

During the capture phase, the transition of the first control signal CS1 from the de-asserted state to the asserted state results in the fifth clock signal CLK5 transitioning from the de-asserted state to the asserted state. Such a positive edge of the fifth clock signal CLK5 may result in an inaccurate flip-flop operation if passed through to the second scan flip-flop 116. The second control signal CS2 is thus de-asserted for the first predetermined time duration of the capture phase to deactivate the second clock gate 208 during the transitioning of the first control signal CS1, and in turn, of the fifth clock signal CLK5. The third clock signal CLK3 thus remains unchanged when the fifth clock signal CLK5 transitions from the de-asserted state to the asserted state during the capture phase.

During the functional mode, the first control signal CS1 is de-asserted and the second control signal CS2 is asserted. Thus, the second clock gate 208 may be activated or deactivated based on the first enable signal EB1. Further, as the first clock gate 206 and the processing circuitry 204 are shown to receive the same first enable signal EB1, both the first and second clock gates 206 and 208 may be activated and de-activated when the first enable signal EB1 is asserted and de-asserted, respectively. When the first and second clock gates 206 and 208 are deactivated, the second and third clock signals CLK2 and CLK3 are de-asserted (e.g., are at a logic low state), respectively. Conversely, when the first clock gate 206 is activated, the second clock signal CLK2 is same as the fourth clock signal CLK4, and when the second clock gate 208 is activated, the third clock signal CLK3 is same as the fifth clock signal CLK5. Further, during the functional mode, the fifth clock signal CLK5 is same as the fourth clock signal CL4. Thus, the third clock signal CLK3 is same as the second clock signal CLK2 during the functional mode. Alternatively, if the functional controller 104 provides separate enable signals to the processing circuitry 204 and the first clock gate 206, the second and third clock signals CLK2 and CLK3 may be staggered (e.g., not same) during the functional mode.

Although FIG. 2 illustrates that single processing circuitry (e.g., the processing circuitry 204) controls the second set of clock gates, the scope of the present disclosure is not limited to it. In various other embodiments, each clock gate of the second set of clock gates may be controlled by dedicated processing circuitry, without deviating from the scope of the present disclosure.

The first set of scan flip-flops may receive a clock signal (e.g., the second clock signal CLK2) that is generated based on the fourth clock signal CLK4. On the other hand, the second set of scan flip-flops may receive a clock signal (e.g., the third clock signal CLK3) that is generated based on the fifth clock signal CLK5. Further, the fifth clock signal CLK5 is the inverted version of the fourth clock signal CLK4 during the shift phase. In other words, during the shift phase, the third clock signal CLK3 is the inverted version of the second clock signal CLK2. Thus, the shift operations (e.g., the flip-flop operations during the shift phase) of the first set of scan flip-flops are performed at positive edges of the fourth clock signal CLK4. Conversely, the shift operations of the second set of scan flip-flops are performed at negative edges of the fourth clock signal CLK4 (e.g., positive edges of the fifth clock signal CLK5).

The capture operations (e.g., the flip-flop operations during the capture phase) of the first set of scan flip-flops are performed at a positive edge of the fourth clock signal CLK4. Further, the capture operations of the second set of scan flip-flops may be performed at a negative edge or a positive edge of the fourth clock signal CLK4 based on the first control signal CS1. When the first control signal CS1 is asserted during the capture phase, the fifth clock signal CLK5 is the inverted version of the fourth clock signal CLK4 during the capture phase. Hence, in such a scenario, the capture operations of the second set of scan flip-flops are performed at a negative edge of the fourth clock signal CLK4 (e.g., a positive edge of the fifth clock signal CLK5). When the first control signal CS1 is de-asserted, the fifth clock signal CLK5 is the same as the fourth clock signal CLK4. Hence, in such a scenario, the capture operations of the second set of scan flip-flops are performed at a positive edge of the fourth clock signal CLK4.

Figure 3:
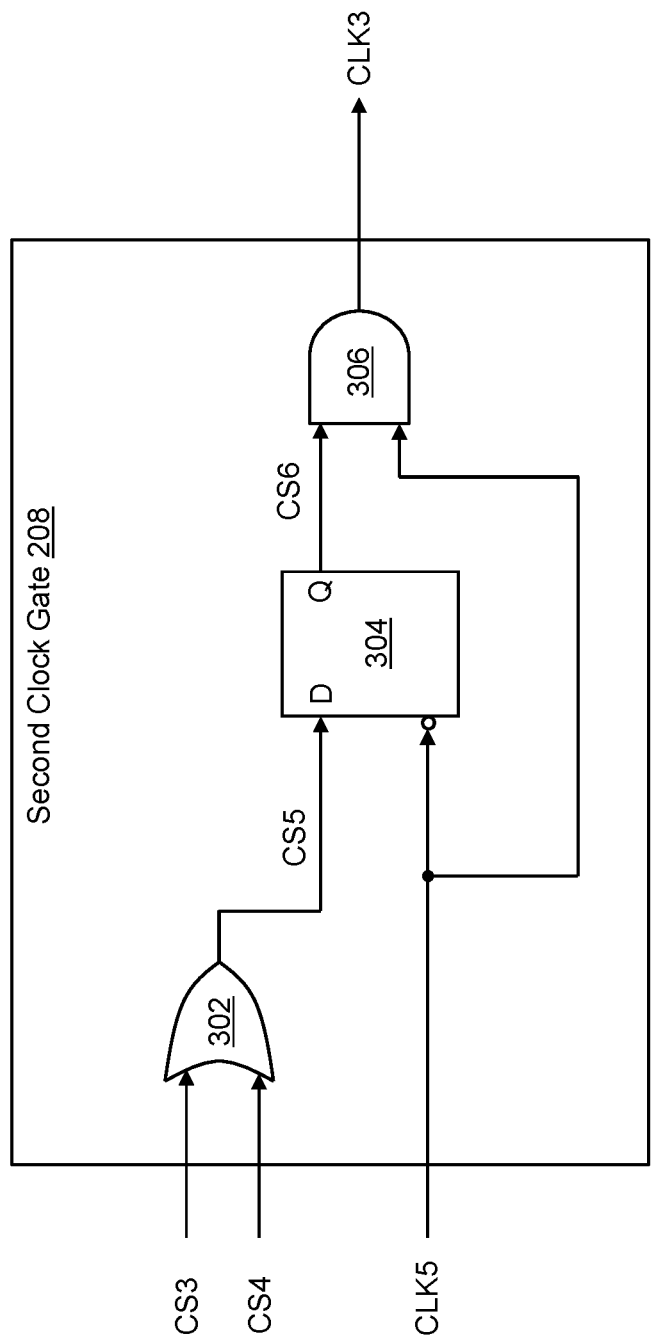
FIG. 3 illustrates a schematic circuit diagram of a clock gate of the clock control system of the IC of FIG. 1 in accordance with an embodiment of the present disclosure.

FIG. 3 illustrates a schematic circuit diagram of the second clock gate 208 in accordance with an embodiment of the present disclosure. The second clock gate 208 may include a third logic gate 302, a latch 304, and a fourth logic gate 306. Each clock gate of the first and second sets of clock gates is structurally similar to the second clock gate 208.

The third logic gate 302 may be coupled to the processing circuitry 204 (e.g., the first and second logic gates 214 and 216). The third logic gate 302 may be configured to receive, from the first and second logic gates 214 and 216, the set of control signals CS3 and CS4 (e.g., the third and fourth control signals CS3 and CS4, respectively). The third logic gate 302 may be further configured to generate a fifth control signal CS5 based on the third and fourth control signals CS3 and CS4. In an embodiment, the third logic gate 302 is an OR gate. Thus, the third logic gate 302 asserts the fifth control signal CS5 (e.g., generates the fifth control signal CS5 at a logic high state) based on the assertion of at least one of the third and fourth control signals CS3 and CS4 (e.g., when at least one of the third and fourth control signals CS3 and CS4 is asserted). Further, the third logic gate 302 de-asserts the fifth control signal CS5 (e.g., generates the fifth control signal CS5 at a logic low state) based on the de-assertion of the third and fourth control signals CS3 and CS4 (e.g., when the third and fourth control signals CS3 and CS4 are de-asserted).

The latch 304 may be coupled to the third logic gate 302 and the processing circuitry 204 (e.g., the clock phase converter circuit 212). The latch 304 may be configured to receive the fifth control signal CS5 from the third logic gate 302 at an input terminal thereof. The latch 304 may be further configured to receive the fifth clock signal CLK5 from the clock phase converter circuit 212 at a clock terminal thereof. The latch 304 may be further configured to generate a sixth control signal CS6 based on the fifth control signal CS5 and the fifth clock signal CLK5 at an output terminal thereof. In an embodiment, the latch 304 is a D-latch and the output and clock terminals of the latch 304 correspond to a positive output terminal and a negative clock terminal, respectively. Thus, the latch 304 may generate the sixth control signal CS6 having the same logic state as that of the fifth control signal CS5 based on the de-assertion of the fifth clock signal CLK5 (e.g., when the fifth clock signal CLK5 is de-asserted). When the fifth clock signal CLK5 is asserted, the sixth control signal CS6 may retain a previous logic state.

The fourth logic gate 306 may be coupled to the latch 304, the processing circuitry 204 (e.g., the clock phase converter circuit 212), and the second scan flip-flop 116. The fourth logic gate 306 may be configured to receive the sixth control signal CS6 and the fifth clock signal CLK5 from the latch 304 and the processing circuitry 204 (e.g., the clock phase converter circuit 212), respectively. The fourth logic gate 306 may be further configured to generate the third clock signal CLK3 based on the fifth clock signal CLK5 and the sixth control signal CS6 and provide the third clock signal CLK3 to the second scan flip-flop 116. In an embodiment, the fourth logic gate 306 is an AND gate. Thus, the fourth logic gate 306 asserts the third clock signal CLK3 (e.g., generates the third clock signal CLK3 at a logic high state) based on the assertion of the sixth control signal CS6 and the fifth clock signal CLK5 (e.g., when the sixth control signal CS6 and the fifth clock signal CLK5 are asserted). Further, the fourth logic gate 306 de-asserts the third clock signal CLK3 (e.g., generates the third clock signal CLK3 at a logic low state) based on the de-assertion of at least one of the sixth control signal CS6 and the fifth clock signal CLK5 (e.g., when at least one of the sixth control signal CS6 and the fifth clock signal CLK5 is de-asserted).

Figure 4:
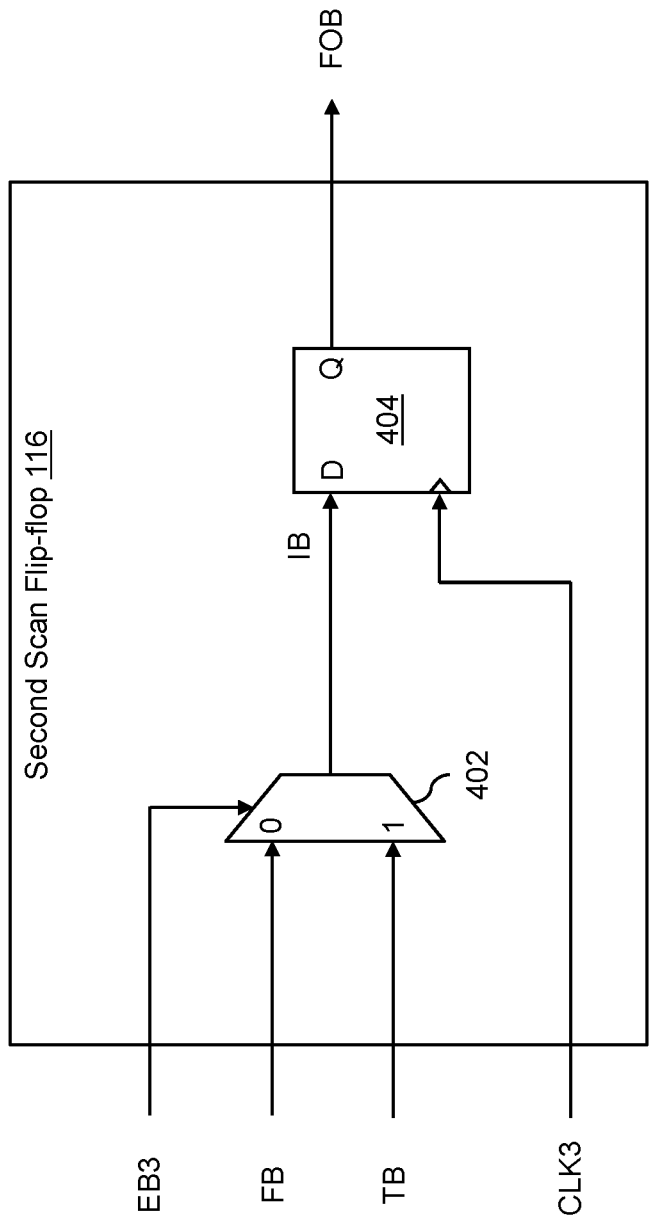
FIG. 4 illustrates a schematic circuit diagram of a scan flip-flop of a scan chain of the IC of FIG. 1 in accordance with an embodiment of the present disclosure.

FIG. 4 illustrates a schematic circuit diagram of the second scan flip-flop 116 in accordance with an embodiment of the present disclosure. The second scan flip-flop 116 may include a multiplexer 402 and a D-flip-flop 404. Each scan flip-flop of the first and second sets of scan flip-flops is structurally similar to the second scan flip-flop 116.

The multiplexer 402 may be configured to receive a functional data bit FB from a functional circuit (not shown) of the IC 100. The multiplexer 402 may be further configured to receive a test pattern bit TB. The test pattern bit TB may be received from another scan flip-flop (not shown) of the scan chain 112 that is adjacently coupled to the second scan flip-flop 116 or from a pattern generator (not shown) of the IC 100. Further, the multiplexer 402 may be coupled to the test controller 108, and configured to receive the third enable signal EB3. Based on the third enable signal EB3, the multiplexer 402 may select and output one of the functional data bit FB and the test pattern bit TB as an intermediate bit IB. In an embodiment, the multiplexer 402 selects and outputs the functional data bit FB as the intermediate bit IB when the second enable signal EB2 is de-asserted (e.g., is at a logic low state). Further, the multiplexer 402 selects and outputs the test pattern bit TB as the intermediate bit IB when the second enable signal EB2 is asserted (e.g., is at a logic high state). Thus, during the functional mode and the capture phase, the multiplexer 402 selects and outputs the functional data bit FB as the intermediate bit IB, and the during the shift phase, the multiplexer 402 selects and outputs the test pattern bit TB as the intermediate bit IB.

The D-flip-flop 404 may be coupled to the multiplexer 402 and the second clock gate 208. The D-flip-flop 404 may be configured to receive the intermediate bit IB from the multiplexer 402 at an input terminal thereof. Further, the D-flip-flop 404 may be configured to receive the third clock signal CLK3 from the second clock gate 208 at a clock terminal thereof. In an embodiment, the D-flip-flop 404 is a positive-edge triggered flip-flop. Thus, when the third clock signal CLK3 transitions from the de-asserted state to the asserted state, the D-flip-flop 404 may be configured to output the intermediate bit IB as a flop output bit FOB. When the third clock signal CLK3 is de-asserted, asserted, or transitions from the asserted state to the de-asserted state, a logic state of the flop output bit FOB is retained.

During the shift phase of the testing mode, the flop output bit FOB corresponds to another test pattern bit which is provided to another scan flip-flop that is adjacently coupled to the second scan flip-flop 116 in the scan chain 112. If the first and second scan flip-flops 114 and 116 are directly coupled to each other, the second scan flip-flop 116 may provide the flop output bit FOB to the first scan flip-flop 114. During the capture phase, the flop output bit FOB may be indicative of the response of the IC 100 to the test pattern. Further, during the functional mode, the flop output bit FOB corresponds to another functional data bit and may be provided to another functional circuit (not shown) for facilitating various functional operations therein.

Figure 5:
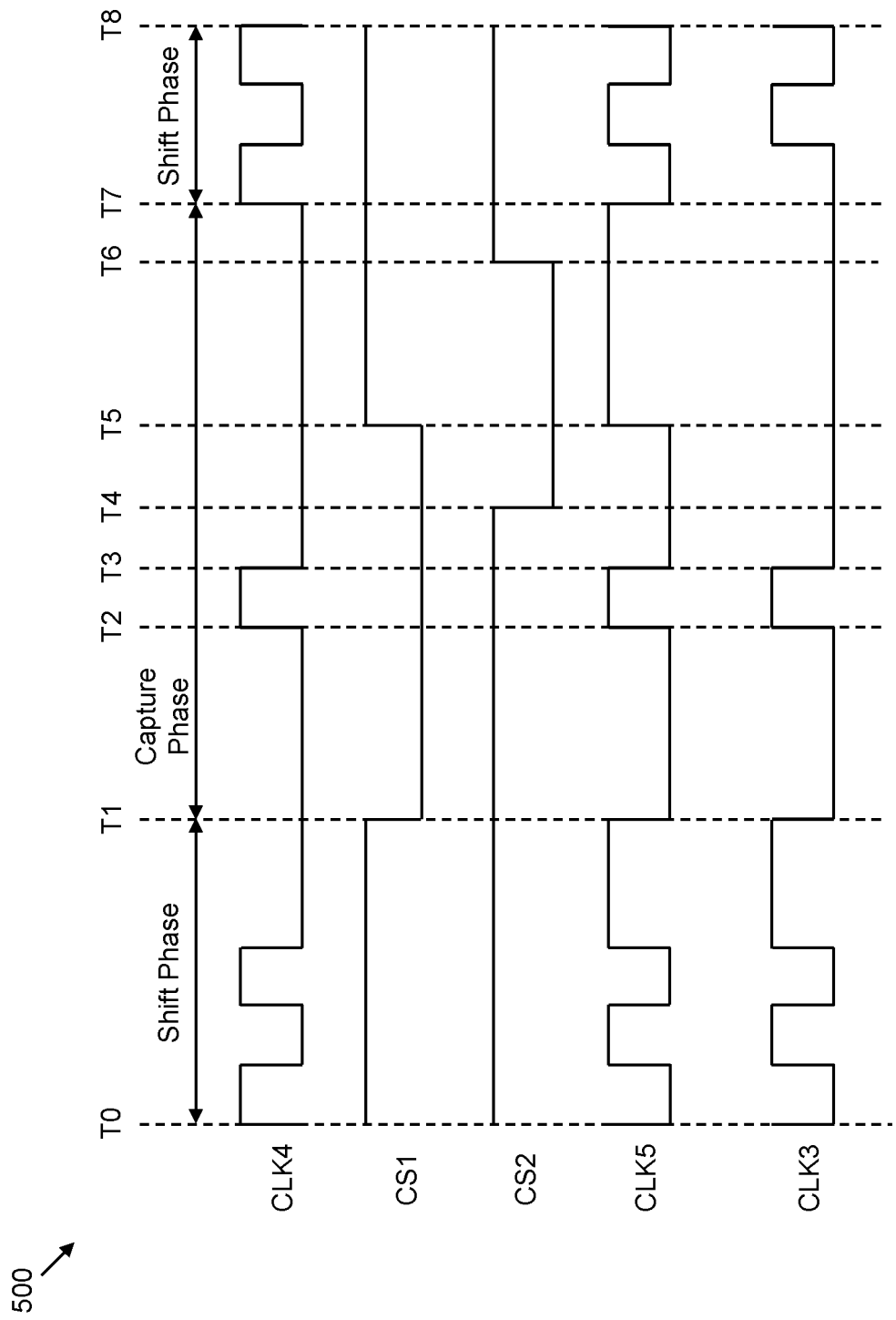
FIG. 5 represents a timing diagram that illustrates an operation of the clock control system of the IC of FIG. 1 in accordance with an embodiment of the present disclosure.

FIG. 5 represents a timing diagram 500 that illustrates an operation of the clock control system 110 in accordance with an embodiment of the present disclosure. The enabling circuit 210 may generate the first and second control signals CS1 and CS2 based on the trigger data TD. Further, the clock phase converter circuit 212 may generate the fifth clock signal CLK5 based on the fourth clock signal CLK4 and the first control signal CS1. The first logic gate 214 may generate the third control signal CS3 based on the first enable signal EB1 and the second control signal CS2. Similarly, the second logic gate 216 may generate the fourth control signal CS4 based on the second enable signal EB2 and the second control signal CS2. For the sake of ongoing discussion, it is assumed that the first enable signal EB1 is at a logic low state and the second enable signal EB2 is at a logic high state during the shift and capture phases. The second clock gate 208 may generate the third clock signal CLK3 based on the fifth clock signal CLK5 and the third and fourth control signals CS3 and CS4.

At time instance T0, the fourth clock signal CLK4 transitions from a logic low state to a logic high state. Further, the first and second control signals CS1 and CS2 are at a logic high state. As the first control signal CS1 is at a logic high state, the fifth clock signal CLK5 is the inverted version of the fourth clock signal CLK4. In other words, the fifth clock signal CLK5 transitions from a logic high state to a logic low state. Further, as the second control signal CS2 and the second enable signal EB2 are at a logic high state, the fourth control signal CS4 is at a logic high state. Hence, the second clock gate 208 is activated and the third clock signal CLK3 is same as the fifth clock signal CLK5. In other words, the third clock signal CLK3 transitions from a logic high state to a logic low state.

During a time period T0-T1, the fourth clock signal CLK4 toggles between logic low and logic high states. Further, the first and second control signals CS1 and CS2 remain at a logic high state. Thus, the fifth clock signal CLK5 is the inverted version of the fourth clock signal CLK4 and the third clock signal CLK3 is same as the fifth clock signal CLK5. Hence, when the fourth clock signal CLK4 is at a logic high state, the fifth clock signal CLK5 and the third clock signal CLK3 are at a logic low state. Conversely, when the fourth clock signal CLK4 is at a logic low state, the fifth clock signal CLK5 and the third clock signal CLK3 are at a logic high state. The time period T0-T1 corresponds to the shift phase. The third clock signal CLK3 is thus the inverted version of the fourth clock signal CLK4, and in turn, the second clock signal CLK2, during the shift phase.

At time instance T1, the first control signal CS1 transitions from a logic high state to a logic low state indicating activation of the capture phase. Further, the fourth clock signal CLK4 is at a logic low state. As the first control signal CS1 transitions from a logic high state to a logic low state, the fifth clock signal CLK5 is same as the fourth clock signal CLK4. In other words, the fifth clock signal CLK5 transitions from a logic high state to a logic low state. Further, the second control signal CS2 remains at a logic high state. As a result, the third clock signal CLK3 is same as the fifth clock signal CLK5. In other words, the third clock signal CLK3 transitions from a logic high state to a logic low state.

During a time period T1-T2, the fourth clock signal CLK4 and the first control signal CS1 remain at a logic low state, and the second control signal CS2 remains at a logic high state. Hence, the fifth clock signal CLK5 and the third clock signal CLK3 remain at a logic low state.

At time instance T2, the fourth clock signal CLK4 transitions from a logic low state to a logic high state. Further, the first control signal CS1 remains at a logic low state. Hence, the fifth clock signal CLK5 transitions from a logic low state to a logic high state. Further, the second control signal CS2 remains at a logic high state. Hence, the third clock signal CLK3 transitions from a logic low state to a logic high state.

During a time period T2-T3, the fourth clock signal CLK4 remains at a logic high state. Further, the first control signal CS1 remains at a logic low state and the second control signal CS2 remains at a logic high state. As a result, the fifth clock signal CLK5 and the third clock signal CLK3 remain at a logic high state.

At time instance T3, the fourth clock signal CLK4 transitions from a logic high state to a logic low state. Further, the first control signal CS1 remains at a logic low state and the second control signal CS2 remains at a logic high state. Thus, the fifth clock signal CLK5 and the third clock signal CLK3 transition from a logic high state to a logic low state.

During a time period T3-T4, the fourth clock signal CLK4 remains at a logic low state. Further, the first control signal CS1 remains at a logic low state and the second control signal CS2 remains at a logic high state. Hence, the fifth clock signal CLK5 and the third clock signal CLK3 remain at a logic low state.

At time instance T4, the second control signal CS2 transitions from a logic high state to a logic low state. Further, the fourth clock signal CLK4 and the first control signal CS1 remain at a logic low state. Hence, the fifth clock signal CLK5 remains at a logic low state. As the second control signal CS2 transitions from a logic high state to a logic low state, the third and fourth control signals CS3 and CS4 are de-asserted. Hence, the second clock gate 208 is deactivated. As a result, the third clock signal CLK3 is at a logic low state.

During a time period T4-T5, the fourth clock signal CLK4 remains at a logic low state. Further, the first and second control signals CS1 and CS2 remain at a logic low state. As the first control signal CS1 and the fourth clock signal CLK4 remain at a logic low state, the fifth clock signal CLK5 remains at a logic low state. Further, as the second control signal CS2 remains at a logic low state, the second clock gate 208 remains deactivated. Hence, the third clock signal CLK3 remains at a logic low state.

At time instance T5, the first control signal CS1 transitions from a logic low state to a logic high state. Further, the fourth clock signal CLK4 remains at a logic low state. As a result, the fifth clock signal CLK5 transitions from a logic low state to a logic high state. In other words, the fifth clock signal CLK5 is the inverted version of the fourth clock signal CLK4. Further, the second control signal CS2 remains at a logic low state. Hence, the second clock gate 208 remains deactivated, and the third clock signal CLK3 remains at a logic low state.

During a time period T5-T6, the fourth clock signal CLK4 remains at a logic low state. Further, the first control signal CS1 remains at a logic high state and the second control signal CS2 remains at a logic low state. Hence, the fifth clock signal CLK5 remains at a logic high state and the third clock signal CLK3 remains at a logic low state.

At time instance T6, the second control signal CS2 transitions from a logic low state to a logic high state. Further, the fourth clock signal CLK4 remains at a logic low state and the first control signal CS1 remains at a logic high state. Hence, the fifth clock signal CLK5 remains at a logic high state. The second clock gate 208 is triggered when the fifth clock signal CLK5 is at a logic low state. As the fifth clock signal CLK5 remains at a logic high state at time instance T6, the third clock signal CLK3 retains a previous state (e.g., remains at a logic low state). The de-assertion of the second control signal CS2 for the time period T4-T6 prevents inaccurate activation of the second clock gate 208 due to transitioning of the first control signal CS1, and in turn, transitioning of the fifth clock signal CLK5 at time instance T5.

During a time period T6-T7, the fourth clock signal CLK4 remains at a logic low state. Further, the first control signal CS1 and the second control signal CS2 remain at a logic high state. As the first control signal CS1 is at a logic high state, the fifth clock signal CLK5 is the inverted version of the fourth clock signal CLK4. In other words, the fifth clock signal CLK5 remains at a logic high state. Further, as the fifth clock signal CLK5 remains at a logic high state, the third clock signal CLK3 remains at a logic low state.

At time instance T7, the fourth clock signal CLK4 transitions from a logic low state to a logic high state. Further, the first control signal CS1 and the second control signal CS2 remain at a logic high state. Thus, the fifth clock signal CLK5 transitions from a logic high state to a logic low state. Further, the third clock signal CLK3 remains at a logic low state.

During a time period T7-T8, the fourth clock signal CLK4 toggles between logic high and logic low states. Further, the first control signal CS1 and the second control signal CS2 remain at a logic high state. The fifth clock signal CLK5 is thus the inverted version of the fourth clock signal CLK4, and the third clock signal CLK3 is same as the fifth clock signal CLK5. Hence, when the fourth clock signal CLK4 is at a logic high state, the fifth clock signal CLK5 and the third clock signal CLK3 are at a logic low state. Conversely, when the fourth clock signal CLK4 is at a logic low state, the fifth clock signal CLK5 and the third clock signal CLK3 are at a logic high state.

Thus, as illustrated in FIG. 5, the fourth clock signal CLK4 includes various clock pulses for facilitating performing various flip-flop operations during the shift and capture phases. The flip-flop operations of the second set of scan flip-flops are performed at positive edges of the third clock signal CLK3 (e.g., negative edges of the fourth clock signal CLK4) during the shift phase. Further, during the capture phase, the flip-flop operations of the second set of scan flip-flops are performed at a positive edge of the third clock signal CLK3 (e.g., a positive edge of the fourth clock signal CLK4). The first set of scan flip-flops performs the associated flip-flop operations at positive edges of the fourth clock signal CLK4 during the shift and capture phases. Thus, the switching activity of the first and second sets of scan flip-flops is divided during the shift phase.

The time period T0-T1 corresponds to the shift phase of the testing mode and the time period T1-T7 corresponds to the capture phase of the testing mode. Further, the time period T7-T8 corresponds to a subsequent shift phase of the testing mode. Although not shown, the shift and capture phases may be separated by various load-unload clock pulses. The time period T1-T5 (e.g., when the first control signal CS1 is at a logic low state) corresponds to the second predetermined time duration. Further, the time period T4-T6 corresponds to the first predetermined time duration. In other words, the time period T4-T5 corresponds to the third predetermined time duration and the time period T5-T6 corresponds to the fourth predetermined time duration.

It will be apparent to a person skilled in the art that the transitions of various signals illustrated in FIG. 5 (such as the third through fifth clock signals CLK3-CLK5, and the first and second control signals CS1 and CS2) are sans set up time associated with each signal to make the illustrations concise and clear and should not be considered as a limitation of the present disclosure.

Figure 6:
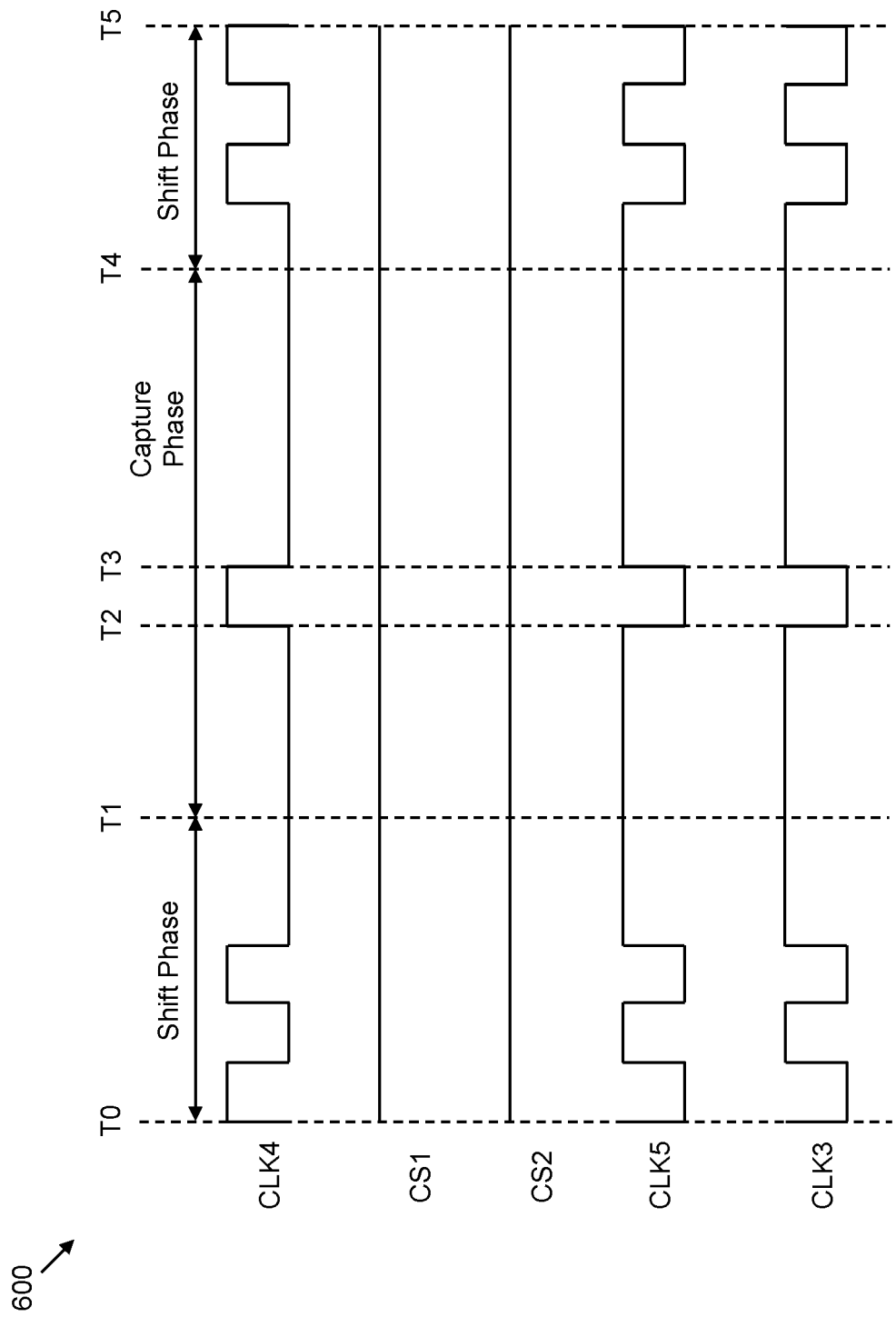
FIG. 6 represents a timing diagram that illustrates the operation of the clock control system of the IC of FIG. 1 in accordance with another embodiment of the present disclosure.

FIG. 6 represents a timing diagram 600 that illustrates the operation of the clock control system 110 in accordance with another embodiment of the present disclosure. The enabling circuit 210 may generate the first and second control signals CS1 and CS2 based on the trigger data TD. Further, the clock phase converter circuit 212 may generate the fifth clock signal CLK5 based on the fourth clock signal CLK4 and the first control signal CS1. The first logic gate 214 may generate the third control signal CS3 based on the first enable signal EB1 and the second control signal CS2. Similarly, the second logic gate 216 may generate the fourth control signal CS4 based on the second enable signal EB2 and the second control signal CS2. For the sake of ongoing discussion, it is assumed that the first enable signal EB1 is at a logic low state and the second enable signal EB2 is at a logic high state during the shift and capture phases of the testing mode. The second clock gate 208 may generate the third clock signal CLK3 based on the fifth clock signal CLK5 and the third and fourth control signals CS3 and CS4.

At time instance T0, the fourth clock signal CLK4 transitions from a logic low state to a logic high state. Further, the first and second control signals CS1 and CS2 are at a logic high state. As the first control signal CS1 is at a logic high state, the fifth clock signal CLK5 is the inverted version of the fourth clock signal CLK4. In other words, the fifth clock signal CLK5 transitions from a logic high state to a logic low state. Further, as the second control signal CS2 and the second enable signal EB2 are at a logic high state, the fourth control signal CS4 is at a logic high state. Hence, the second clock gate 208 is activated and the third clock signal CLK3 is same as the fifth clock signal CLK5. In other words, the third clock signal CLK3 transitions from a logic high state to a logic low state.

During a time period T0-T1, the fourth clock signal CLK4 toggles between logic low and logic high states. Further, the first and second control signals CS1 and CS2 remain at a logic high state. As the first control signal CS1 is at a logic high state, the fifth clock signal CLK5 is generated as the inverted version of the fourth clock signal CLK4. Similarly, as the second control signal CS2 is at a logic high state, the third clock signal CLK3 is same as the fifth clock signal CLK5. Hence, when the fourth clock signal CLK4 is at a logic high state, the fifth clock signal CLK5 and the third clock signal CLK3 are at a logic low state. Conversely, when the fourth clock signal CLK4 is at a logic low state, the fifth clock signal CLK5 and the third clock signal CLK3 are at a logic high state. The time period T0-T1 corresponds to the shift phase.

At time instance T1, the capture phase is activated. The first and second control signals CS1 and CS2 remain at a logic high state. Further, the fourth clock signal CLK4 is at a logic low state. Thus, the fifth clock signal CLK5 and the third clock signal CLK3 remain at a logic high state.

During a time period T1-T2, the fourth clock signal CLK4 remains at a logic low state, and the first and second control signals CS1 and CS2 remain at a logic high state. As a result, the fifth clock signal CLK5 and the third clock signal CLK3 remain at a logic high state.

At time instance T2, the fourth clock signal CLK4 transitions from a logic low state to a logic high state. Further, the first control signal CS1 and the second control signal CS2 remain at a logic high state. As the first control signal CS1 is at a logic high state, the fifth clock signal CLK5 is the inverted version of the fourth clock signal CLK4. In other words, the fifth clock signal CLK5 transitions from a logic high state to a logic low state. Further, as the second control signal CS2 remains at a logic high state, the third clock signal CLK3 is same as the fifth clock signal CLK5. In other words, the third clock signal CLK3 transitions from a logic high state to a logic low state.

During a time period T2-T3, the fourth clock signal CLK4 remains at a logic high state. Further, the first control signal CS1 and the second control signal CS2 remain at a logic high state. As a result, the fifth clock signal CLK5 and the third clock signal CLK3 remain at a logic low state.

At time instance T3, the fourth clock signal CLK4 transitions from a logic high state to a logic low state. Further, the first control signal CS1 and the second control signal CS2 remain at a logic high state. As a result, the fifth clock signal CLK5 and the third clock signal CLK3 transition from a logic low state to a logic high state.

During a time period T3-T4, the fourth clock signal CLK4 remains at a logic low state, and the first and second control signals CS1 and CS2 remain at a logic high state. As a result, the fifth clock signal CLK5 and the third clock signal CLK3 remain at a logic high state. The time period T1-T4 corresponds to the capture phase of the testing mode.

At time instance T4, a subsequent shift phase is activated. The fourth clock signal CLK4 remains at a logic low state and the first and second control signals CS1 and CS2 remain at a logic high state. Thus, the fifth clock signal CLK5 and the third clock signal CLK3 remain at a logic high state.

During a time period T4-T5, the fourth clock signal CLK4 toggles between logic low and logic high states. Further, the first control signal CS1 and the second control signal CS2 remain at a logic high state. The fifth clock signal CLK5 is thus the inverted version of the fourth clock signal CLK4, and the third clock signal CLK3 is same as the fifth clock signal CLK5. Hence, when the fourth clock signal CLK4 is at a logic high state, the fifth clock signal CLK5 and the third clock signal CLK3 are at a logic low state. Conversely, when the fourth clock signal CLK4 is at a logic low state, the fifth clock signal CLK5 and the third clock signal CLK3 are at a logic high state.

As illustrated in FIG. 6, the second set of scan flip-flops performs the associated flip-flop operations at positive edges of the third clock signal CLK3 (e.g., negative edges of the fourth clock signal CLK4) during the shift and capture phases. On the other hand, the first set of scan flip-flops performs the associated flip-flop operations at positive edges of the fourth clock signal CLK4 during the shift and capture phases. Thus, the switching activity of the first and second sets of scan flip-flops is divided during the shift and capture phases.

It will be apparent to a person skilled in the art that the transitions of various signals illustrated in FIG. 6 (such as the third through fifth clock signals CLK3-CLK5 and the first and second control signals CS1 and CS2) are sans set up time associated with each signal to make the illustrations concise and clear and should not be considered as a limitation of the present disclosure.

Figure 7:
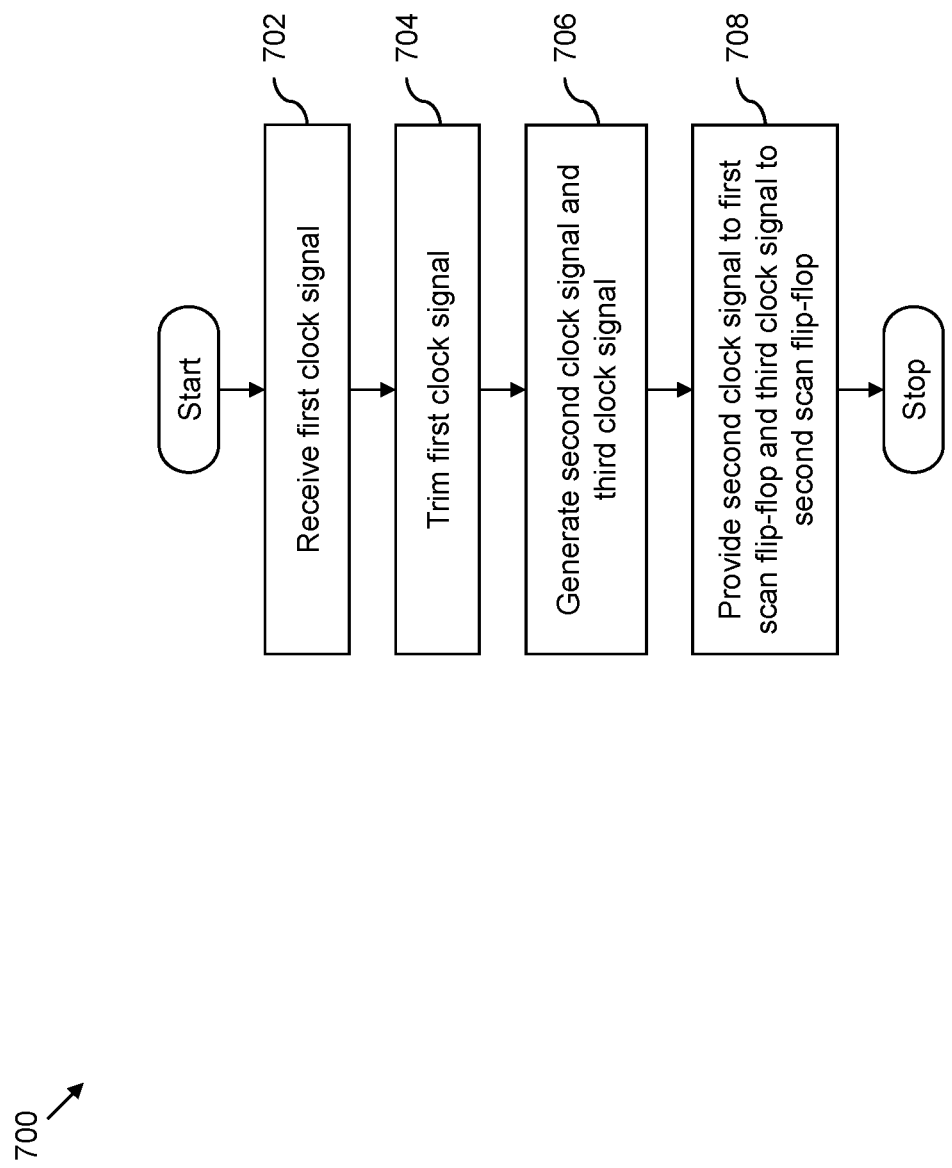
FIG. 7 represents a flowchart that illustrates a clock control method for the scan chain of the IC of FIG. 1 in accordance with an embodiment of the present disclosure.

FIG. 7 represents a flowchart 700 that illustrates a clock control method for the scan chain 112 (e.g., the first and second scan flip-flops 114 and 116) in accordance with an embodiment of the present disclosure. The clock control method is implemented by the clock control system 110.

At step 702, the clock control system 110 may receive the first clock signal CLK1 from the clock generator 102. At step 704, the clock control system 110 may trim the first clock signal CLK1 to generate the fourth clock signal CLK4. At step 706, the clock control system 110 may generate the second clock signal CLK2 and the third clock signal CLK3 based on the fourth clock signal CLK4. During the shift phase, the third clock signal CLK3 is the inverted version of the second clock signal CLK2. During the capture phase, the third clock signal CLK3 may be the inverted version of the second clock signal CLK2 or may be same as the second clock signal CLK2. At step 708, the clock control system 110 may provide the second clock signal CLK2 and the third clock signal CLK3 to the first scan flip-flop 114 and the second scan flip-flop 116, respectively. The first scan flip-flop 114 and the second scan flip-flop 116 may perform the first flip-flop operation and the second flip-flop operation when the second clock signal CLK2 and the third clock signal CLK3 transition from the de-asserted state to the asserted state, respectively. The first flip-flop operation and the second flip-flop operation are mutually exclusive during the shift phase. The first and second flip-flop operations may be mutually exclusive or may be performed simultaneously during the capture phase.

Thus, during the shift phase or during both the shift and capture phases, the first set of scan flip-flops performs the associated flip-flop operations at positive edges of the fourth clock signal CLK4, whereas the second set of scan flip-flops performs the associated flip-flop operations at negative edges of the fourth clock signal CLK4. As a result, the first and second sets of scan flip-flops do not simultaneously perform the associated flip-flop operations during the shift phase or during both the shift and capture phases. Hence, a dynamic voltage drop across the scan chain 112 is significantly reduced.

Conventionally, various scan chains of an IC are divided into multiple partitions (e.g., an LBIST partition) with each partition including a fixed number of scan flip-flops. The scan chains of different partitions receive staggered clock signals. Such a technique of controlling the scan chains reduces a dynamic voltage drop in the IC during a testing mode of the scan chains. Within a partition, however, the scan flip-flops of various scan chains continue to perform the associated flip-flop operations simultaneously. A number of scan flip-flops in a partition is still significant, and hence, the dynamic voltage drop across the scan chains of one partition is still significant. Also, as such scan flip-flops are located in close proximity on the IC, localized voltage hotspots are created on the IC that may damage the IC. When the scan chains are partitioned, a dedicated test controller is required to be included on the IC for controlling the scan flip-flops of each partition. Hence, the partitioning of the scan chains leads to a significant increase in the design complexity and the size of the IC. Further, in some cases, partitioning of the scan chains on the IC may not be feasible, and hence, some conventional techniques of controlling scan chains cannot be implemented in such ICs.

In the clock control system 110, the first and second sets of scan flip-flops of a single scan chain 112 perform associated flip-flop operations in a non-simultaneous manner. Thus, the dynamic voltage drop in the IC 100 is reduced. Further, the scan flip-flops included in the scan chain 112 are uniformly located on the IC 100 to prevent the creation of localized voltage hotspots on the IC 100. As the dynamic voltage drop is reduced by ensuring that two sets of scan flip-flops of each scan chain do not perform associated flip-flop operations simultaneously, a need to partition the scan chains is eliminated. Hence, the design complexity of the IC 100 is significantly less than that of an IC where some conventional techniques of controlling scan chains are implemented. Further, as the scan chains are not partitioned, a need to include a dedicated test controller in the IC 100 for controlling scan flip-flops of each partition is eliminated. Hence, the size of the IC 100 is significantly less than that of the IC where some conventional techniques of controlling scan chains are implemented.

The term "assert" is used to mean placing a signal in an active state. For example, for an active-low signal, the signal is at a logic low state when asserted, and for an active-high signal, the signal is at a logic high state when asserted.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:
1. A circuit, comprising:
   a scan chain that comprises a first scan flip-flop and a second scan flip-flop; and
   a clock control system that is coupled to the scan chain, and configured to:

generate a first clock signal and a second clock signal, wherein during a shift phase of a testing mode of the scan chain, the first clock signal is an inverted version of the second clock signal; and provide the first clock signal and the second clock signal to the first scan flip-flop and the second scan flip-flop, respectively, wherein the first scan flip-flop is configured to perform a first flip-flop operation when the first clock signal transitions from a de-asserted state to an asserted state, and the second scan flip-flop is configured to perform a second flip-flop operation when the second clock signal transitions from the de-asserted state to the asserted state, and wherein the first flip-flop operation and the second flip-flop operation are mutually exclusive during the shift phase;

wherein the clock control system comprises:

processing circuitry configured to receive a third clock signal and generate a fourth clock signal based on the third clock signal, wherein during the shift phase, the fourth clock signal is an inverted version of the third clock signal, and wherein during a capture phase of the testing mode, the fourth clock signal is one of a group consisting of (i) the inverted version of the third clock signal and (ii) same as the third clock signal; and a first clock gate that is coupled to the processing circuitry and the first scan flip-flop, and configured to receive the fourth clock signal and generate the first clock signal based on the fourth clock signal, wherein the first clock signal is de-asserted when the first clock gate is deactivated, and the first clock signal is same as the fourth clock signal when the first clock gate is activated, and wherein the first clock gate is further configured to provide the first clock signal to the first scan flip-flop.

2. The circuit of claim 1, wherein during a capture phase of the testing mode, the first clock signal is one of a group consisting of (i) the inverted version of the second clock signal and (ii) same as the second clock signal.

3. The circuit of claim 2, wherein during the capture phase, when the first clock signal is the inverted version of the second clock signal, the first flip-flop operation and the second flip-flop operation are mutually exclusive.

4. The circuit of claim 2, wherein during the capture phase, when the first clock signal is same as the second clock signal, the first flip-flop operation and the second flip-flop operation are performed simultaneously.

5. The circuit of claim 1, wherein the processing circuitry is further configured to generate a set of control signals to deactivate and activate the first clock gate, wherein the first clock gate is activated based on assertion of at least one control signal of the set of control signals, and wherein the first clock gate is deactivated based on de-assertion of the set of control signals.

6. The circuit of claim 1, wherein when the fourth clock signal is the inverted version of the third clock signal during the shift phase and is same as the third clock signal during the capture phase, the first clock gate is activated during the shift phase and deactivated for a predetermined time duration during the capture phase, and wherein when the fourth clock signal is the inverted version of the third clock signal during the shift phase and the capture phase, the first clock gate is activated during the shift phase and the capture phase.

7. The circuit of claim 1, wherein the processing circuitry comprises an enabling circuit configured to receive trigger data that is indicative of the testing mode and generate a first control signal and a second control signal based on the trigger data, wherein a logic state of the fourth clock signal is controlled based on the first control signal, and wherein the first clock gate is controlled based on the second control signal.

8. The circuit of claim 7, wherein during the shift phase and the capture phase, the first control signal is asserted to enable inversion of the third clock signal, and the second control signal is asserted to activate the first clock gate.

9. The circuit of claim 7, wherein during the shift phase, the first control signal is asserted to enable inversion of the third clock signal, and the second control signal is asserted to activate the first clock gate, wherein during the capture phase, the first control signal is de-asserted for a first predetermined time duration, and transitions from the de-asserted state to the asserted state after lapse of the first predetermined time duration to disable the inversion of the third clock signal during the capture phase, and wherein the second control signal is de-asserted for a second predetermined time duration before the assertion of the first control signal and a third predetermined time duration after the assertion of the first control signal to deactivate the first clock gate during the transition of the first control signal from the de-asserted state to the asserted state.

10. The circuit of claim 7, wherein the processing circuitry further comprises a clock phase converter circuit that is coupled to the enabling circuit and the first clock gate, and configured to receive the first control signal and the third clock signal, generate the fourth clock signal based on the first control signal and the third clock signal, and provide the fourth clock signal to the first clock gate, wherein based on assertion of the first control signal, the fourth clock signal is the inverted version of the third clock signal, and wherein based on de-assertion of the first control signal, the fourth clock signal is same as the third clock signal.

11. The circuit of claim 7, wherein the processing circuitry further comprises:

a first logic gate that is coupled to the enabling circuit and the first clock gate, and configured to (i) generate a third control signal based on the second control signal and a first enable signal that is indicative of a functional mode of the scan chain and (ii) provide the third control signal to the first clock gate, wherein the third control signal is asserted based on assertion of the second control signal and the first enable signal, and de-asserted based on de-assertion of at least one of a group consisting of the second control signal and the first enable signal; and a second logic gate that is coupled to the enabling circuit and the first clock gate, and configured to (i) generate a fourth control signal based on the second control signal and a second enable signal that is indicative of the testing mode, and (ii) provide the fourth control signal to the first clock gate, wherein the fourth control signal is asserted based on the assertion of the second control signal and assertion of the second enable signal, and de-asserted based on at least one of a group consisting of the de-assertion of the second control signal and de-assertion of the second enable signal, and wherein the first clock gate is activated based on the assertion of at least one of a group consisting of the third control signal and the fourth control signal, and deactivated based on the de-assertion of the third control signal and the fourth control signal.

12. The circuit of claim 11, further comprising a functional controller and a test controller that are configured to generate the first enable signal and the second enable signal, respectively, wherein the first enable signal is one of a group consisting of asserted and de-asserted during the functional mode to control the first clock gate during the functional mode, and wherein the second enable signal is asserted during the shift phase and the capture phase of the testing mode to control the first clock gate during the testing mode.

13. The circuit of claim 11, wherein the first clock gate comprises:
   a third logic gate that is coupled to the first logic gate and the second logic gate, and configured to generate a fifth control signal based on the third control signal and the fourth control signal, wherein the fifth control signal is de-asserted based on the de-assertion of the third control signal and the fourth control signal, and the fifth control signal is asserted based on the assertion of at least one of a group consisting of the third control signal and the fourth control signal;
   a latch that is coupled to the third logic gate, and configured to receive the fifth control signal and the fourth clock signal, and generate a sixth control signal based on the fifth control signal and the fourth clock signal, wherein the sixth control signal is same as the fifth control signal based on de-assertion of the fourth clock signal; and
   a fourth logic gate that is coupled to the latch and the first scan flip-flop, and configured to generate the first clock signal based on the sixth control signal and the fourth clock signal, wherein the first clock signal is asserted based on assertion of the sixth control signal and the fourth clock signal, and the first clock signal is de-asserted based on at least one of a group consisting of (i) de-assertion of the sixth control signal and (ii) the de-assertion of the fourth clock signal.

14. The circuit of claim 1, wherein the third clock signal comprises one or more clock pulses for facilitating one or more flip-flop operations during the shift phase, respectively, and one or more clock pulses for facilitating one or more flip-flop operations during the capture phase, respectively.

15. The circuit of claim 1, wherein the clock control system further comprises a trimming circuit that is configured to receive a fifth clock signal and generate the third clock signal such that a number of clock pulses of the third clock signal is less than a number of clock pulses of the fifth clock signal.

16. The circuit of claim 1, wherein the clock control system comprises a second clock gate that is coupled to the second scan flip-flop, and configured to receive a third clock signal, generate the second clock signal based on the third clock signal, and provide the second clock signal to the second scan flip-flop, wherein the third clock signal comprises one or more clock pulses for facilitating one or more flip-flop operations during the shift phase, respectively, and one or more clock pulses for facilitating one or more flip-flop operations during a capture phase of the testing mode, respectively, wherein the second clock signal is de-asserted when the second clock gate is deactivated, and the second clock signal is same as the third clock signal when the second clock gate is activated, and wherein the second clock gate is activated during the shift phase and the capture phase.

17. A clock control method for a scan chain, the clock control method comprising:
   generating, by a clock control system, a first clock signal and a second clock signal, wherein during a shift phase of a testing mode of the scan chain, the first clock signal is an inverted version of the second clock signal; and
   providing, by the clock control system, the first clock signal and the second clock signal to a first scan flip-flop and a second scan flip-flop of the scan chain, respectively, wherein a first flip-flop operation of the first scan flip-flop is performed when the first clock signal transitions from a de-asserted state to an asserted state, and a second flip-flop operation of the second scan flip-flop is performed when the second clock signal transitions from the de-asserted state to the asserted state, and wherein the first flip-flop operation and the second flip-flop operation are mutually exclusive during the shift phase;
   wherein the clock control system comprises:
      processing circuitry configured to receive a third clock signal and generate a fourth clock signal based on the third clock signal, wherein during the shift phase, the fourth clock signal is an inverted version of the third clock signal, and wherein during a capture phase of the testing mode, the fourth clock signal is one of a group consisting of (i) the inverted version of the third clock signal and (ii) same as the third clock signal; and
      a first clock gate that is coupled to the processing circuitry and the first scan flip-flop, and configured to receive the fourth clock signal and generate the first clock signal based on the fourth clock signal, wherein the first clock signal is de-asserted when the first clock gate is deactivated, and the first clock signal is same as the fourth clock signal when the first clock gate is activated, and wherein the first clock gate is further configured to provide the first clock signal to the first scan flip-flop.

18. The clock control method of claim 17, wherein during a capture phase of the testing mode, the first clock signal is the inverted version of the second clock signal, and the first flip-flop operation and the second flip-flop operation are mutually exclusive.

19. The clock control method of claim 17, wherein during a capture phase of the testing mode, the first clock signal is same as the second clock signal, and the first flip-flop operation and the second flip-flop operation are performed simultaneously.

* * * * *